United States Patent
Park et al.

(10) Patent No.: US 12,302,569 B2
(45) Date of Patent: May 13, 2025

(54) SEMICONDUCTOR DEVICE AND MANUFACTURING METHOD OF SEMICONDUCTOR DEVICE

(71) Applicant: SK hynix Inc., Icheon-si (KR)

(72) Inventors: Sun Mi Park, Icheon-si (KR); Eun Mee Kwon, Icheon-si (KR); Hyung Jun Yang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 484 days.

(21) Appl. No.: 17/730,805

(22) Filed: Apr. 27, 2022

(65) Prior Publication Data

US 2023/0140566 A1    May 4, 2023

(30) Foreign Application Priority Data

Oct. 28, 2021  (KR) .................. 10-2021-0145676

(51) Int. Cl.
  *H10B 43/27*   (2023.01)
  *H10B 41/27*   (2023.01)
  *H10B 63/00*   (2023.01)

(52) U.S. Cl.
  CPC ............ *H10B 43/27* (2023.02); *H10B 41/27* (2023.02); *H10B 63/34* (2023.02)

(58) Field of Classification Search
  CPC ......... H10B 43/27; H10B 63/34; H10B 41/27
  USPC ............................................. 257/314
  See application file for complete search history.

(56) References Cited

U.S. PATENT DOCUMENTS

| | | | |
|---|---|---|---|
| 2016/0204041 A1* | 7/2016 | Kim | H10B 43/27 438/14 |
| 2017/0062456 A1* | 3/2017 | Sugino | H10B 43/10 |
| 2019/0326317 A1* | 10/2019 | Jung | H10B 43/27 |

FOREIGN PATENT DOCUMENTS

KR   1020180008959 A   1/2018

* cited by examiner

*Primary Examiner* — Xia L Cross
(74) *Attorney, Agent, or Firm* — WILLIAM PARK & ASSOCIATES LTD.

(57) ABSTRACT

There are provided a semiconductor device and a manufacturing method of a semiconductor device. The semiconductor device includes: a gate structure including conductive layers and insulating layers, which are alternately stacked; channel structures penetrating the gate structure, the channel structures being arranged in a first direction; and a cutting structure extending in the first direction, the cutting structure consecutively penetrating the channel structures. Each of the channel structures includes a first channel structure and a second channel structure, which are isolated from each other by the cutting structure.

20 Claims, 30 Drawing Sheets

ND MANUFACTURING METHOD OF
SEMICONDUCTOR DEVICE

SEMICONDUCTOR DEVICE AND MANUFACTURING METHOD OF SEMICONDUCTOR DEVICE

CROSS-REFERENCE TO RELATED APPLICATION

The present application claims priority under 35 U.S.C. § 119(a) to Korean patent application number 10-2021-0145676 filed on Oct. 28, 2021, in the Korean Intellectual Property Office, the entire disclosure of which is incorporated by reference herein.

BACKGROUND

1. Technical Field

The present disclosure generally relates to an electronic device, and more particularly, to a semiconductor device and a manufacturing method of a semiconductor device.

2. Related Art

A nonvolatile memory device is a memory device in which stored data is retained as it is even when the supply of power is interrupted. As the improvement of the degree of integration of semiconductor devices in which memory cells are formed in the form of a single layer over a substrate reaches the limit, there has recently been proposed a three-dimensional nonvolatile memory device in which memory cells are stacked vertically over a substrate.

The three-dimensional nonvolatile memory device includes interlayer insulating layers and gate electrodes, which are alternately stacked, and channel layers penetrating the interlayer insulating layers and the gate electrodes, and memory cells are stacked along the channel layers, Various structures and manufacturing methods have been developed so as to improve the operational reliability of such a nonvolatile memory device having a three-dimensional structure.

SUMMARY

In accordance with an embodiment of the present disclosure, there may be provided a semiconductor device including: a gate structure including conductive layers and insulating layers, which are alternately stacked; channel structures penetrating the gate structure, the channel structures being arranged in a first direction; and a cutting structure extending in the first direction, the cutting structure consecutively penetrating the channel structures, wherein each of the channel structures includes a first channel structure and a second channel structure, which are isolated from each other by the cutting structure, and wherein portions of the first channel structure and the second channel structure, which are in contact with the cutting structure, are concave.

In accordance with an embodiment of the present disclosure, there may be provided a method of manufacturing a semiconductor device, the method including: forming a stack structure; forming channel structures penetrating the stack structure, the channel structures being arranged in a first direction; isolating each of the channel structures into a first channel structure and a second channel structure, wherein an isolation space is formed by performing an etching process of etching sidewalls of the first channel structure and the second channel structure to form portions of the first channel structure and the second channel structure that are concave; and forming a cutting structure by filling the isolation space with an insulating material.

In accordance with an embodiment of the present disclosure, there may be provided a semiconductor device including: a gate structure including conductive layers and insulating layers, which are alternately stacked; channel structures penetrating the gate structure, the channel structures being arranged in a first direction; and a cutting structure extending in the first direction, the cutting structure consecutively penetrating the channel structures, wherein each of the channel structures includes a first channel structure and a second channel structure, which are isolated from each other by the cutting structure, and wherein the cutting structure includes protrusion parts protruding to the inside of the first channel structure and the second channel structure.

In accordance with an embodiment of the present disclosure, there may be provided a method of manufacturing a semiconductor device, the method including: forming a stack structure; forming channel structures penetrating the stack structure, the channel structures being arranged in a first direction; forming a trench isolating each of the channel structures into a first channel structure and a second channel structure while consecutively penetrating the channel structures, the trench extending in the first direction; etching, to a certain thickness, a channel layer of the first channel structure and the second channel structure, which is exposed by the trench, by performing an etching process; and forming a cutting structure by filling the trench with an insulating material.

BRIEF DESCRIPTION OF THE DRAWINGS

Examples of embodiments will now be described more fully hereinafter with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present, Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Figure 1:
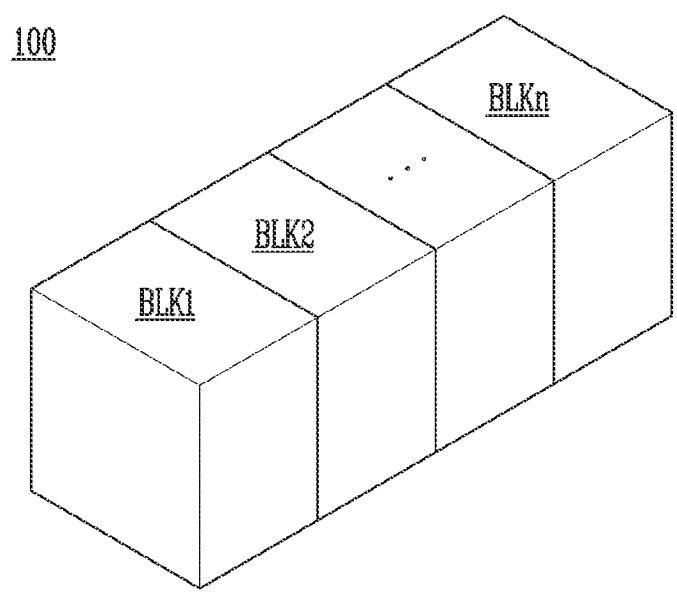
FIG. 1 is a block diagram illustrating a semiconductor device in accordance with an embodiment of the present disclosure.

Embodiments provide a semiconductor device having a stable structure and improved characteristics, and a manufacturing method of a semiconductor device, FIG. 1 is a block diagram illustrating a semiconductor device in accordance with an embodiment of the present disclosure.

Referring to FIG. 1, the semiconductor device 100 may include a plurality of memory blocks BLK1 to BLKn.

Each of the memory blocks BLK1 to BLKn may include a source line, bit lines, memory cell strings electrically connected to the source line and the bit lines, word lines electrically connected to the in memory cell strings, and select lines electrically connected to the memory cell strings. Each of the memory cell strings may include memory cells and select transistors, which are connected in series by a channel pattern. The select lines and the word lines may be used as gate electrodes of the select transistors and the memory cells.

Figure 2A:
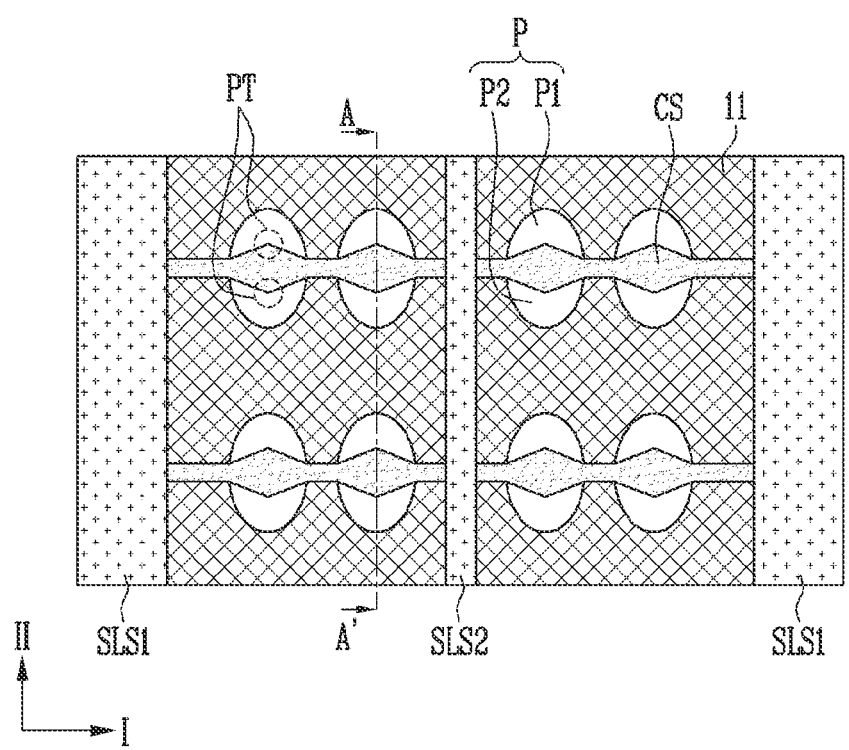
FIGS. 2A and 2B are views illustrating a structure of a semiconductor device in accordance with an embodiment of the present disclosure.
Figure 2B:
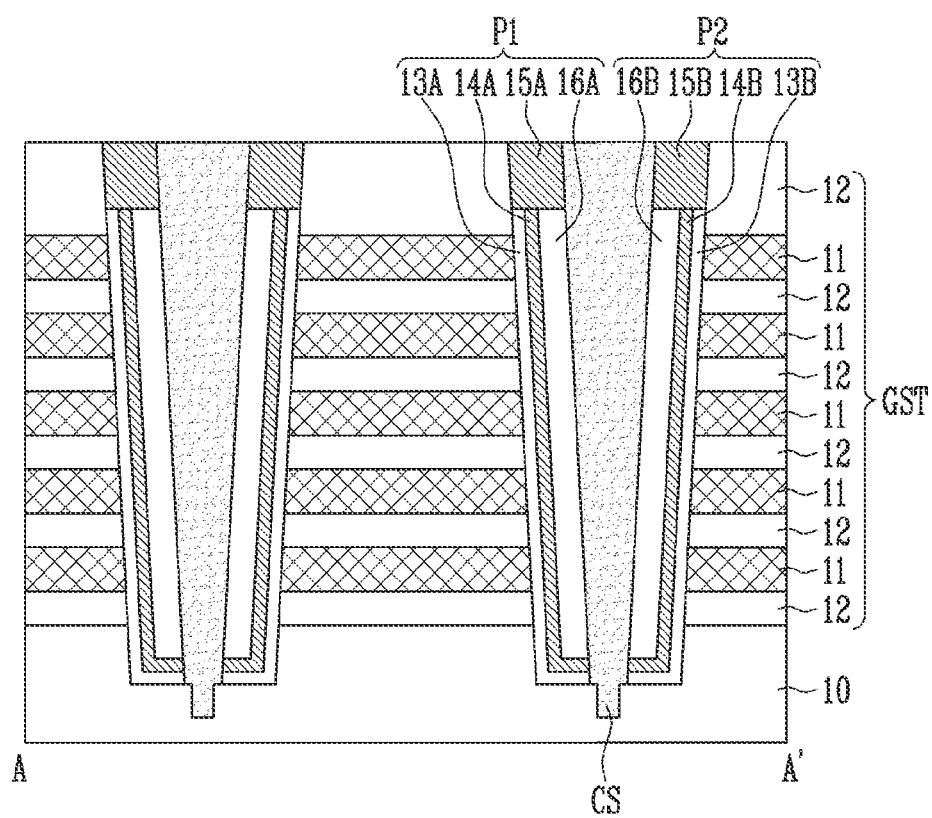

FIGS. 2A and 2B are views illustrating a structure of a semiconductor device in accordance with an embodiment of the present disclosure.

Referring to FIGS. 2A and 2B, the semiconductor device may include a gate structure GST, pillar structures P, a cutting structure CS, and a first slit structure SLS1. The semiconductor device may further include a base 10 and a second slit structure SLS2.

The gate structure GST may include conductive layers 11 and insulating layers 12, which are alternately stacked. The conductive layers 11 may be gate electrodes of a memory cell, a select transistor, and the like. The conductive layers 11 may include a conductive material such as poly-silicon, tungsten, molybdenum, or a metal. The insulating layers 12 may be used to insulate the stacked conductive layers 11 from each other. The insulating layers 12 may include an insulating material such as oxide, nitride, or a gap. In some embodiments a gap may include air and in other embodiments the gap may include a gas. In some embodiments, a gap may include a combination of a gas and air.

The gate structure GST may be disposed on the base 10. The base 10 may be a semiconductor substrate, a source layer, or the like. The semiconductor substrate may include a source region doped with an impurity. The source layer may include a conductive material such as poly-silicon, tungsten, molybdenum, or a metal.

The pillar structures P may penetrate the gate structure GST, The pillar structures P may be arranged in a first direction I and a second direction II intersecting the first direction I, In an embodiment, the pillar structures P may be arranged in a matrix form.

Each of the pillar structures P may include a first pillar structure P1 and a second pillar structure P2. The pillar structure P may be isolated into a pair of first and second pillar structures P1 and P2 by the cutting structure CS. The pair of first and second pillar structures P1 and P2 may be adjacent to each other in the second direction II with the cutting structure CS interposed therebetween, and have a symmetrical structure with respect to the cutting structure CS. A portion of each of the pair of first and second pillar structures P1 and P2, which is in contact with the cutting structure CS, may be formed concave.

In an embodiment, the pillar structures P may be a channel structure including a channel layer 14A and 14B. The first pillar structure P1 may be a first channel structure, and the second pillar structure P2 may be a second channel structure. First memory cells or select transistors may be located at positions at which the first pillar structure P1 and the conductive layers 11 intersect each other, and second memory cells or select transistors may be located at positions at which the second pillar structure P2 and the conductive layers 11 intersect each other. A first in memory cell and a second memory cell, which are adjacent to each other in the second direction II with the cutting structure CS interposed therebetween, may be individually driven.

The first pillar structure P1 may include a first channel layer 14A. The first channel layer 14A may be a region in which a channel including a memory cell, a select transistor, and the like is formed. The first channel layer 14A may include a semiconductor material such as silicon or germanium. The first pillar structure P1 may further include a first conductive pad 15A. The first conductive pad 15A may be connected to the first channel layer 14A, and include a conductive material. The first pillar structure P1 may further include a first insulating core 16A. The first insulating core 16A may include an insulating material such as oxide, nitride, or an air gap. The first pillar structure P1 may further include a first memory layer 13A located between the first channel layer 14A and the conductive layers 11. The first memory layer 13A may include at least one of a tunneling layer, a data storage layer, and a blocking layer. The data storage layer may include a floating gate, a charge trap material, poly-silicon, nitride, a variable resistance material, or a nano structure, or include a combination thereof.

The second pillar structure P2 may have a structure similar to the structure of the first pillar structure P1. The second pillar structure P2 may include a second channel layer 14B. The second pillar structure P2 may further include a second memory layer 13B, a second conductive pad 15B, or a second insulating core 16B, or further include a combination in thereof.

The cutting structure CS may penetrate the pillar structure P, and extend down to the base 10. The cutting structure CS may penetrate the gate structure GST and the pillar structures P, and extend in the first direction I. The cutting structure CS may continuously penetrate the pillar structures P. The cutting structure CS may traverse at least two pillar structures P arranged in the first direction I, and isolate one pillar structure P into a pair of first and second pillar structures P1 and P2. The cutting structure CS may have a line shape between pillar structures P adjacent to each other in the first direction I, and the line-shaped cutting structure CS may penetrate the gate structure GST. Also, the cutting structure CS penetrating the pillar structures P may have a rhombus shape. That is, the cutting structure CS may have a pattern in which the rhombus-shaped cutting structure penetrating the pillar structure P and the line-shaped cutting structure penetrating the gate structure GST are connected to each other. In other words, the cutting structure CS may have a lane shape, and have protrusion parts PT protruding toward the first pillar structure P1 and the second pillar structure P2 at a portion penetrating the pillar structure P, The protrusion part PT nay have a triangular pattern. The cutting structure CS may include an insulating material such as oxide, nitride, or an air gap.

A plurality of cutting structures CS may be located between a pair of first slit structures SLS1. The cutting structures CS may be arranged in the first direction I and the second direction II.

The first slit structure SLS1 may penetrate the gate structure GST. The first slit structure SLS1 may extend in a direction intersecting the cutting structure CS. The first slit structure SLS1 may extend in the second direction II. In an embodiment, the first slit structure SLS1 may be arranged to be orthogonal to the cutting structure CS. The first slit structure SLS1 may include an insulating material.

The second slit structure SLS2 may penetrate the gate structure GST to a depth shallower than a depth of the first slit structure SLS1 or the cutting structure CS. The second slit structure SLS2 may have a depth to which the second slit structure SLS2 penetrates at least one uppermost conductive layer 11. In an embodiment, the second slit structure SLS2 may have a depth to which the second slit structure SLS2 penetrates at least one conductive layer 11 corresponding to a select line among the conductive layers 11 and does not penetrate conductive layers 11 corresponding to word lines. In an embodiment, from the plurality of conductive layers 11, the uppermost conductive layer 11 may be a conductive layer 11 furthest from the base 10.

The numbers of the first and second slit structures SLS1 and SLS2 and the pillar structures P, which are shown in FIGS. 2A and 2B, may be variously changed. For example, the number of pillar structures P located between a pair of first slit structures SLS1, the number of pillar structure P located between the first slit structure SLS1 and the second slit structure SLS2, the number of cutting structures CS located between a pair of first slit structures SLS1, the number of cutting structures CS located in between the first slit structure SLS1 and the second slit structure SLS2, and the like may be changed.

According to the structure described above, one pillar structure P can be isolated into a plurality of pillar structures P1 and P2 by using the cutting structure CS. Thus, the number of memory cells implemented with one pillar structure P can be increased. Although the stacked number of the conductive layers 11 included in the gate structure GST is not increased, the number of memory cells included in the gate structure GST can be increased.

Further, the angle formed by a section at an edge portion of the first channel layer 14A or the second channel layer 14B of each of the pillar structures P1 and P2 can be smaller than 90 degrees due to the protrusion parts PT of the cutting structure CS. Accordingly, in an embodiment, an electric field of the first channel layer 14A and the second channel layer 14B is reinforced, so that the program efficiency of memory cells can be improved.

FIGS. 3A, 3B, 4A, 4B, 5A, 5B, 6A to 6C, 7A, and 7B are views illustrating a manufacturing method of a semiconductor device in accordance with an embodiment of the present disclosure.

Figure 3A:
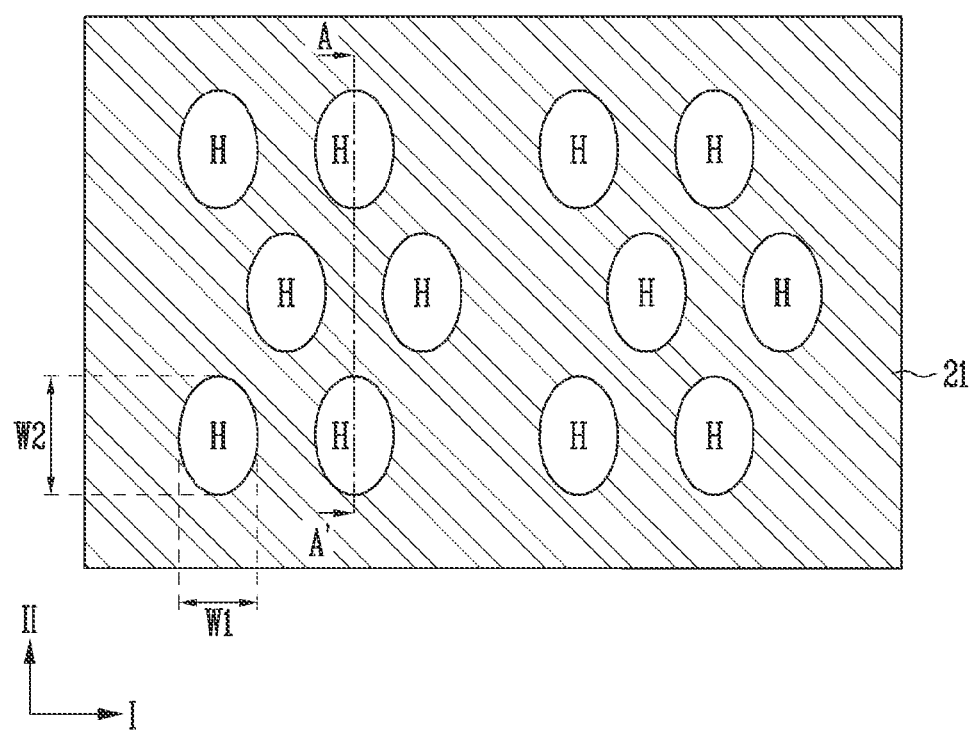
FIGS. 3A, 3B, 4A, 4B, 5A, 5B, 6A, 6B, 6C, 7A, and 7B are views illustrating a manufacturing method of a semiconductor device in accordance with an embodiment of the present disclosure.
Figure 3B:
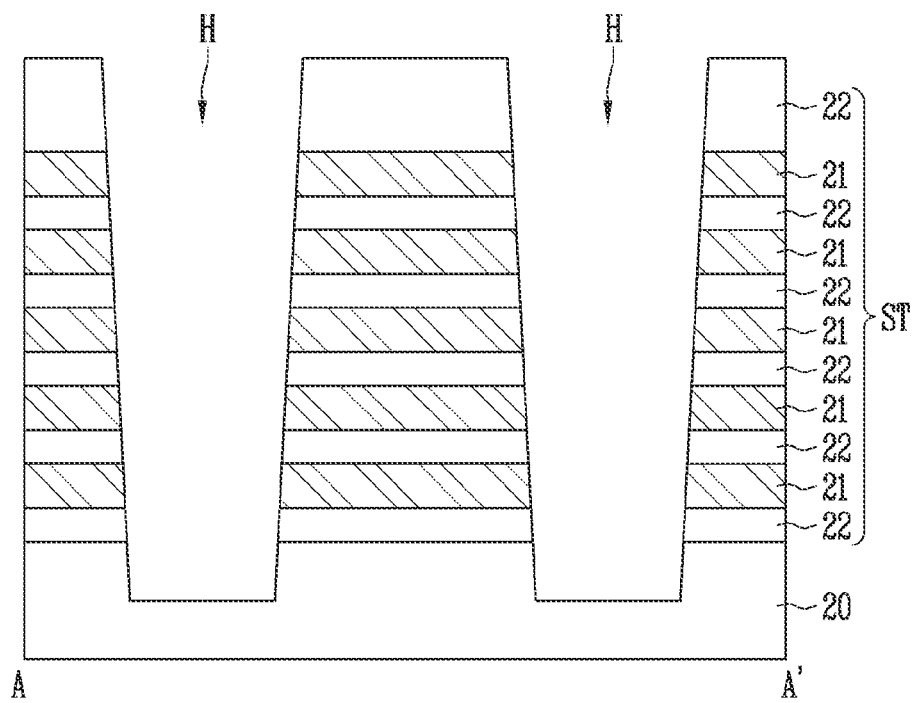

Referring to FIGS. 3A and 3B, a stack structure ST may be formed on a base 20. The base 20 may include or may be a semiconductor substrate, a source structure, or the like. The semiconductor substrate may include a source region doped with an impurity. The source structure may include a source layer including a conductive material such as a poly-silicon, tungsten, molybdenum, or a metal. Alternatively, the source structure may include a sacrificial layer to be replaced with the source layer in a subsequent process.

First material layers 21 and second material layers 22 may be alternately formed, thereby forming the stack structure ST. The first material layers 21 may include a material having a high etch selectivity with respect to the second material layers 22. In an example, the first material layer 21 may include a sacrificial material such as nitride, and the second material layers 22 may include an insulating material such as oxide. In another example, the first material layers 21 may include a conductive material such as poly-silicon, tungsten or molybdenum, and the second material layers 22 may include an insulating material such as oxide.

Subsequently, holes H may be formed, which penetrate the stack structure ST. The holes H may be arranged in a first direction I and a second direction II intersecting the first direction I. Holes H adjacent to each other in the first direction I may be arranged such that the centers of the holes H accord with each other. Holes H arranged in the second direction II may be arranged such that the centers of the holes H are dislocated. The holes H may have a shape such as a circular shape, an elliptical shape, or a polygonal shape.

A plane of each of the holes H may have a first width W1 in the first direction I, and have a second width W2 in the second direction II. The first width W1 and the second width W2 may be the same or be different from each other. For example, the second width W2 may be wider in than the first width W1.

Figure 4A:
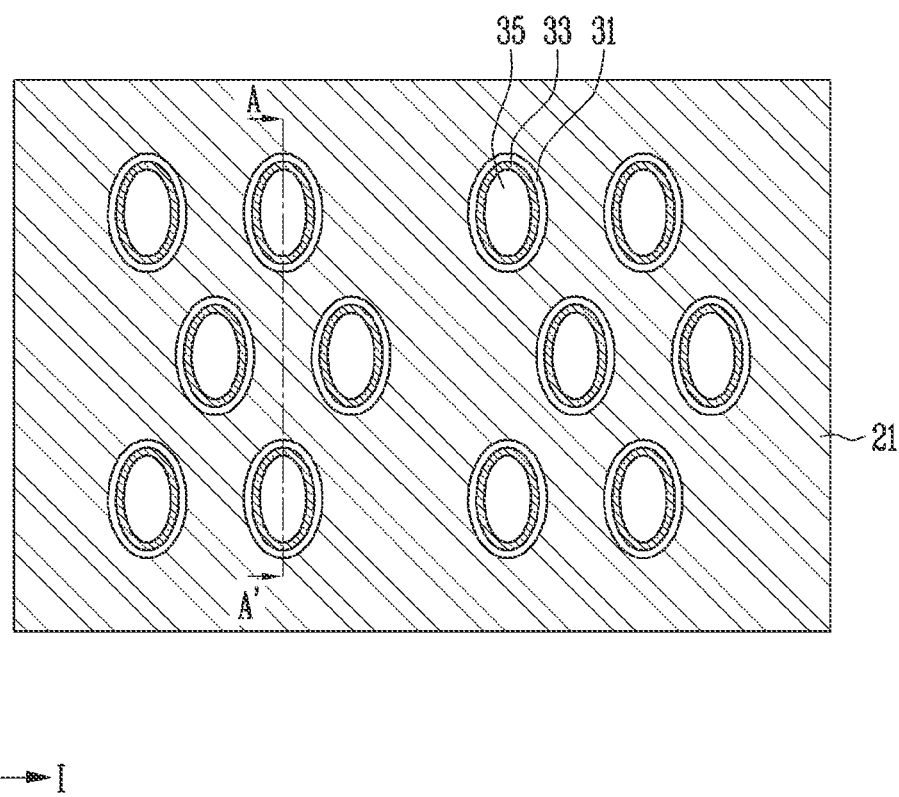
Figure 4B:
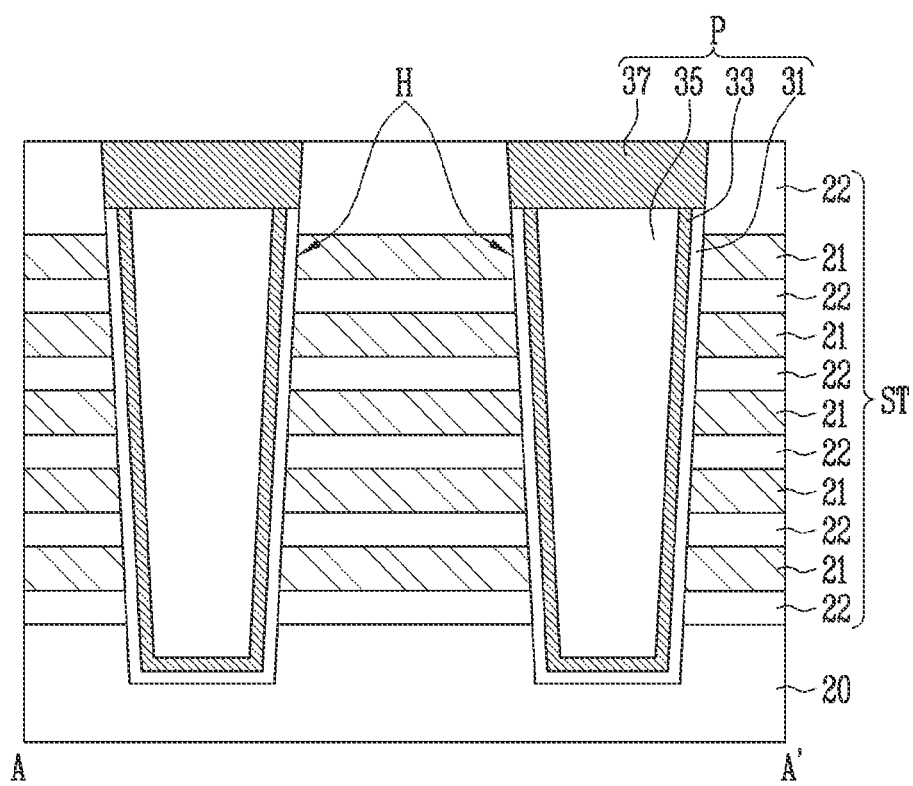

Referring to FIGS. 4A and 4B, pillar structures P may be formed in the holes H. Each of the pillar structures P may include a memory layer 31, a channel layer 33, and an insulating core 35. In an embodiment, after the memory layer 31 is formed along a sidewall and a bottom surface of the hole H penetrating the stack structure ST, the channel layer 33 may be formed along a surface of the memory layer 31. Subsequently, after the insulating core 35 is formed such that a central region of the hole H is buried, a conductive pad 37 may be formed. For example, the memory layer 31, the channel layer 33, and the insulating core 35 may be etched such that a height of an uppermost surface of the memory layer 31, the channel layer 33, and the insulating core 35 is equal to or lower than a height of an uppermost second material layer 22, and the conductive pad 37 may be formed to fill the etched region.

Figure 5A:
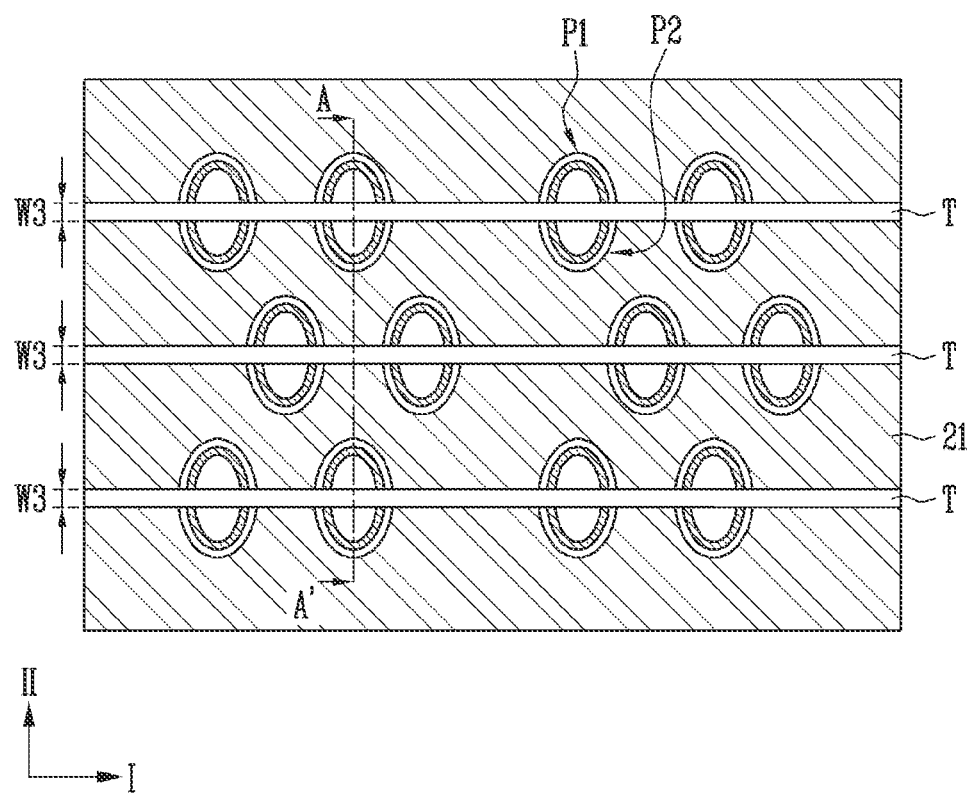
Figure 5B:
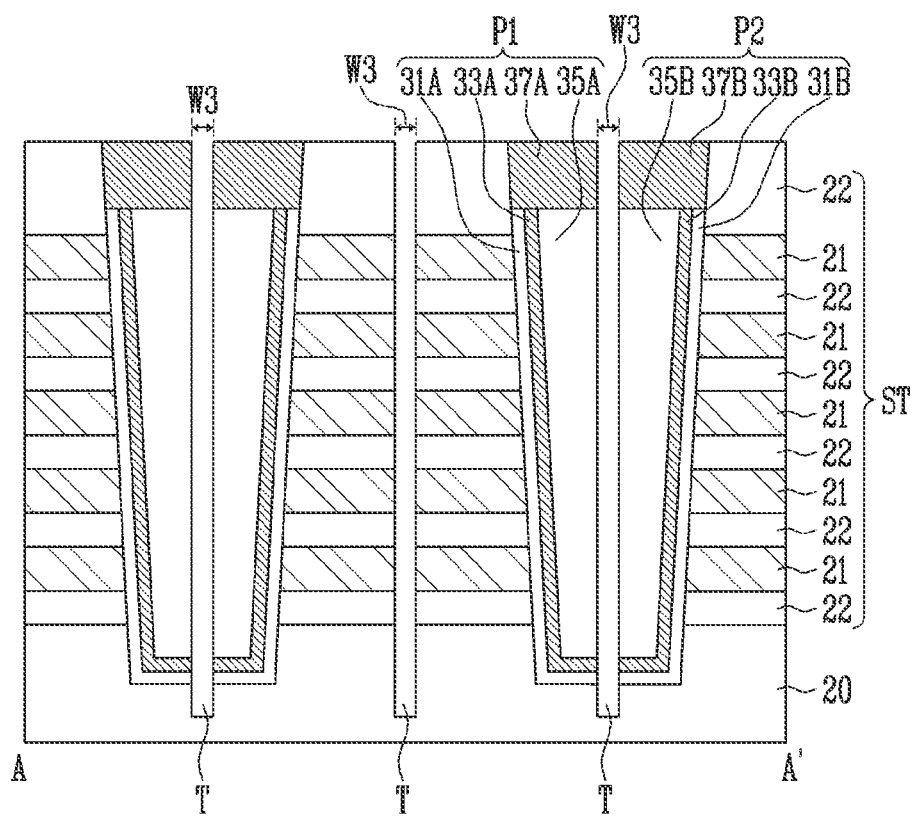

Referring to FIGS. 5A and 5B, a plurality of trenches T extending in the first direction I may be formed by performing an etching process. The plurality of trenches T may have a line shape penetrating the stack structure ST and the pillar structures. Accordingly, each of the pillar structures P shown in FIGS. 4A and 4B may be isolated into a first pillar structure P1 and a second pillar structure P2. Widths W3 of the plurality of trenches T may be equal to each other. In addition, sidewalls of the first pillar structure P1 and the second pillar structure P2 may be exposed by the plurality of line-shaped trenches T. That is, sidewalls of a first conductive pad 37A, a first insulating core 35A, a first channel layer 33A, and a first memory layer 31A of the first pillar structure P1, which are in contact with the trench T, may be exposed, and sidewalls of a second conductive pad 37B, a second insulating core 35B, a second channel layer 33B, and a second memory layer 31B of the second pillar structure P2, which are in contact with the trench T, may be exposed.

Figure 6A:
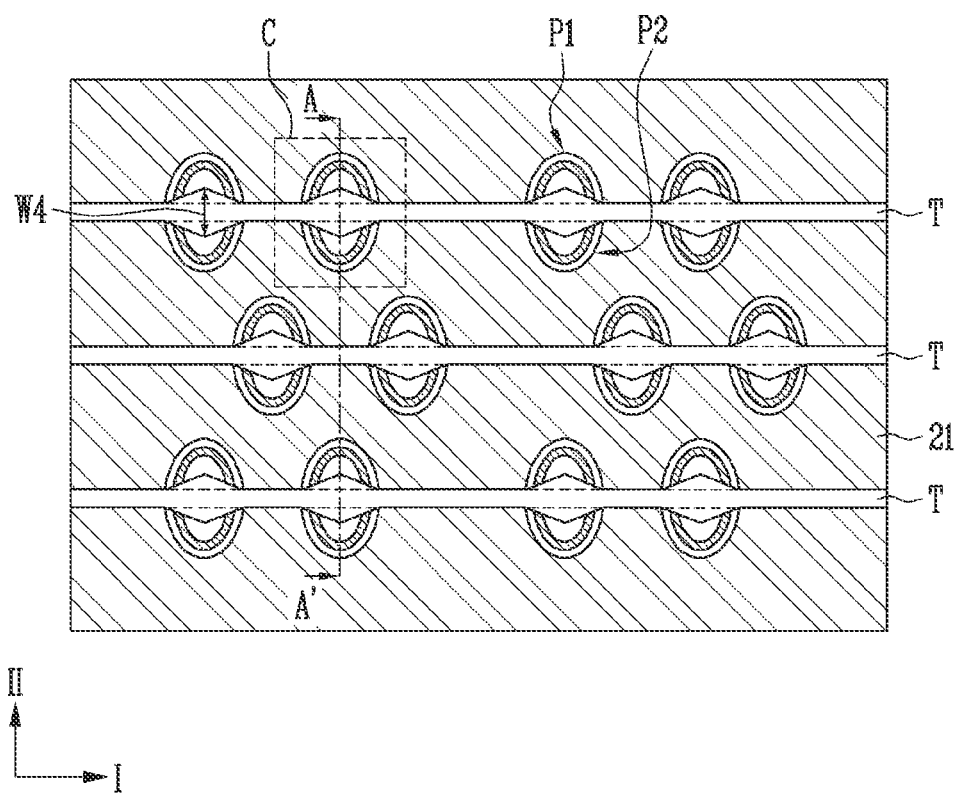
Figure 6B:
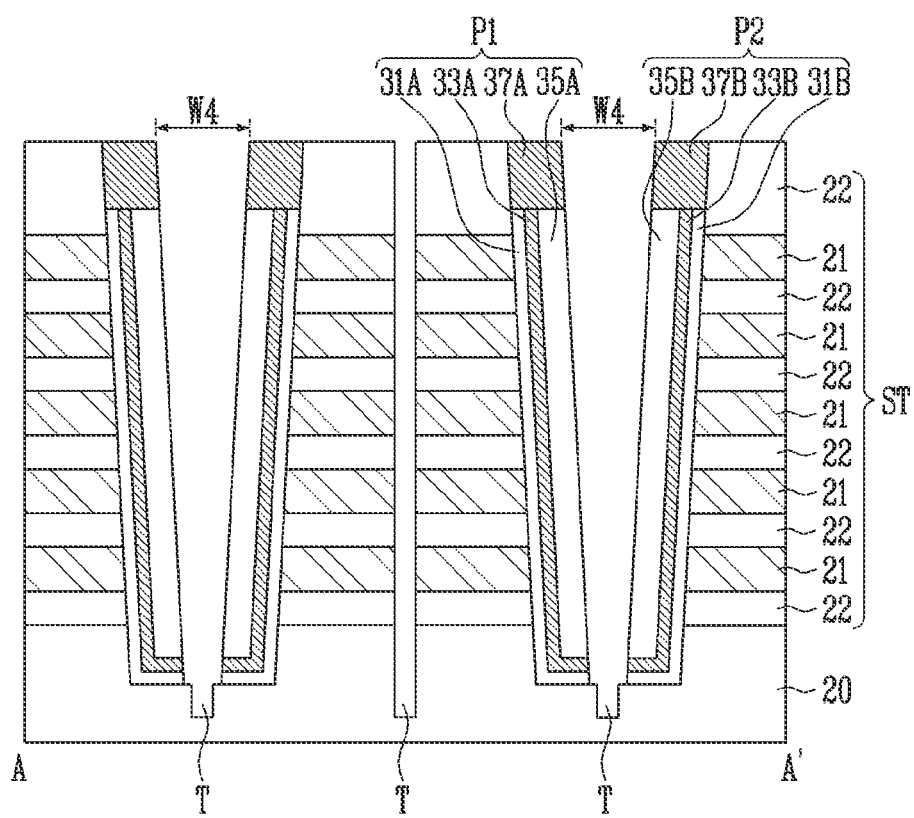
Figure 6C:
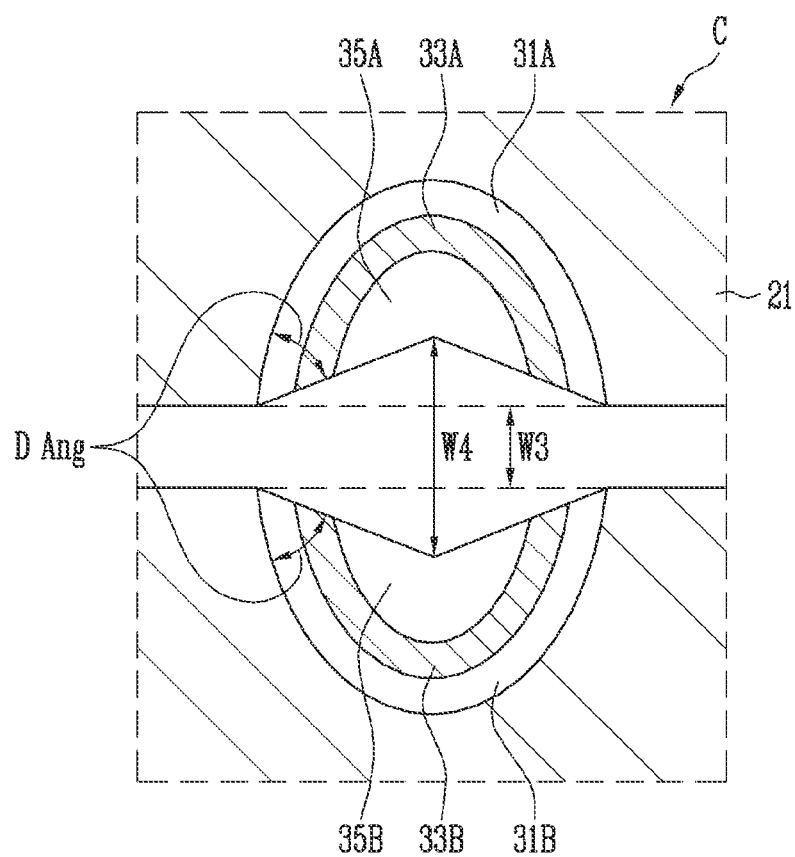

Referring to FIGS. 6A to 6C, the sidewall of the first pillar structure P1 and the sidewall of the second pillar structure P2 may be etched by performing an additional etching process. Accordingly, a width W4 of the trench T between the first pillar structure P1 and the second pillar structure P2 may become wider than the width W3 of the trench T before the additional etching process. The additional etching process may be performed such that a central region of the sidewall of the first pillar structure P1 and a central region of the sidewall of the second pillar structure P2 are etched concave. For example, the additional etching process may be performed such that an angle D Ang formed by a section of an exposed edge region of the first channel layer 33A and the first memory layer 31A becomes an acute angle and an angle D Ang formed by a section of an exposed edge region of the second channel layer 33B and the second memory layer 31B becomes an acute angle. That is, an etching amount of the first channel layer 33A may be increased as the first channel layer 33A becomes more adjacent to the first insulating core 35A, and an etching amount of the second channel layer 33B may be increased as the second channel layer 33B becomes more adjacent to the second insulating core 35B.

Referring to FIGS. 5A, 5B, and 6A to 6C, which are described above, a first etching process for forming the line-shaped trench which isolates each of the pillar structures P into the first pillar structure P1 and the second pillar structure P2 and a second etching process of concavely etching the sidewalls of the first pillar structure P1 and the second pillar structure P2, which are exposed through the trench T, such that an edge portion of the channel layer of each of the first pillar structure P1 and the second pillar structure P2 forms an acute angle may be sequentially performed. In an embodiment, a first etching process for forming the line-shaped trench which isolates each of the pillar structures P into the first pillar structure P1 and the second pillar structure P2 and a second etching process of etching the sidewalls of the first pillar structure P1 and the second pillar structure P2, which are exposed through the trench T, to form portions of the first channel structure and the second channel structure that are concave such that an edge portion of the channel layer of each of the first pillar structure P1 and the second pillar structure P2 forms an acute angle may be sequentially performed. In another embodiment, the first etching process and the second process, which are described above, may be performed through a one-time etching process. For example, a mask pattern having a rhombus-shape open region may be formed at an upper portion of each of the pillar structure P, and the first pillar structure P1 and the second pillar structure P2 may be isolated from each other by etching the pillar structure P exposed through the open region. An etching process may be performed such that the edge portion of the channel layer of each in of the first pillar structure P1 and the second pillar structure P2 forms an acute angle.

Figure 7A:
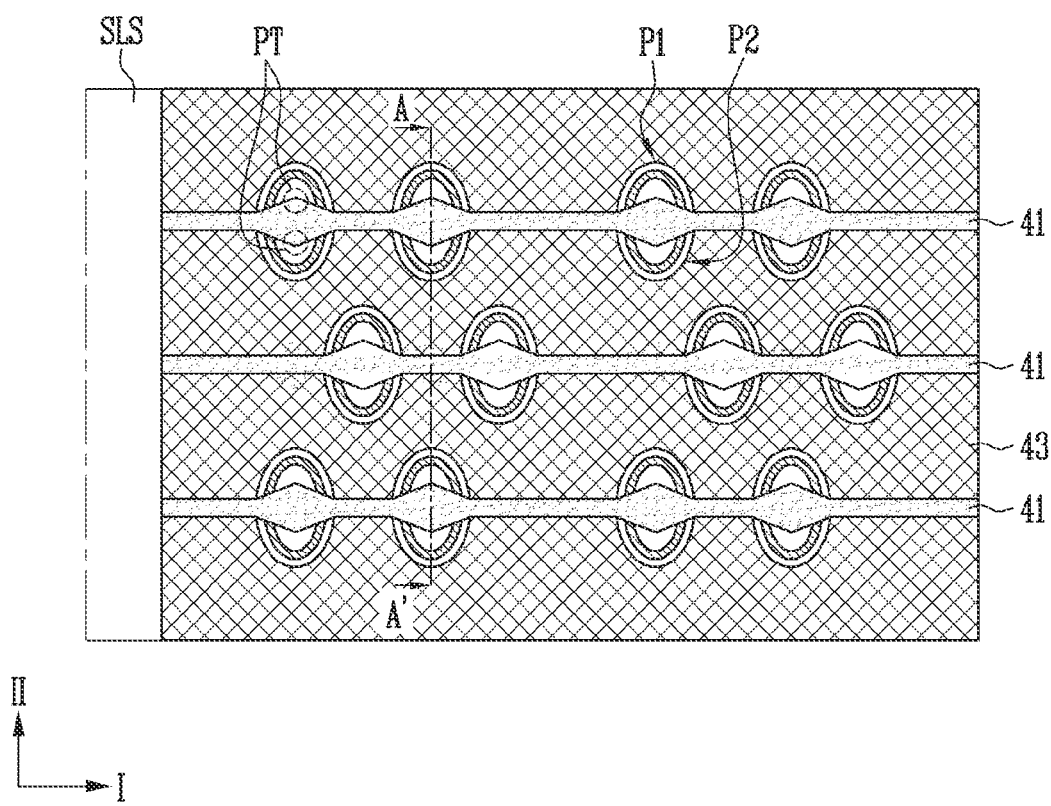
Figure 7B:
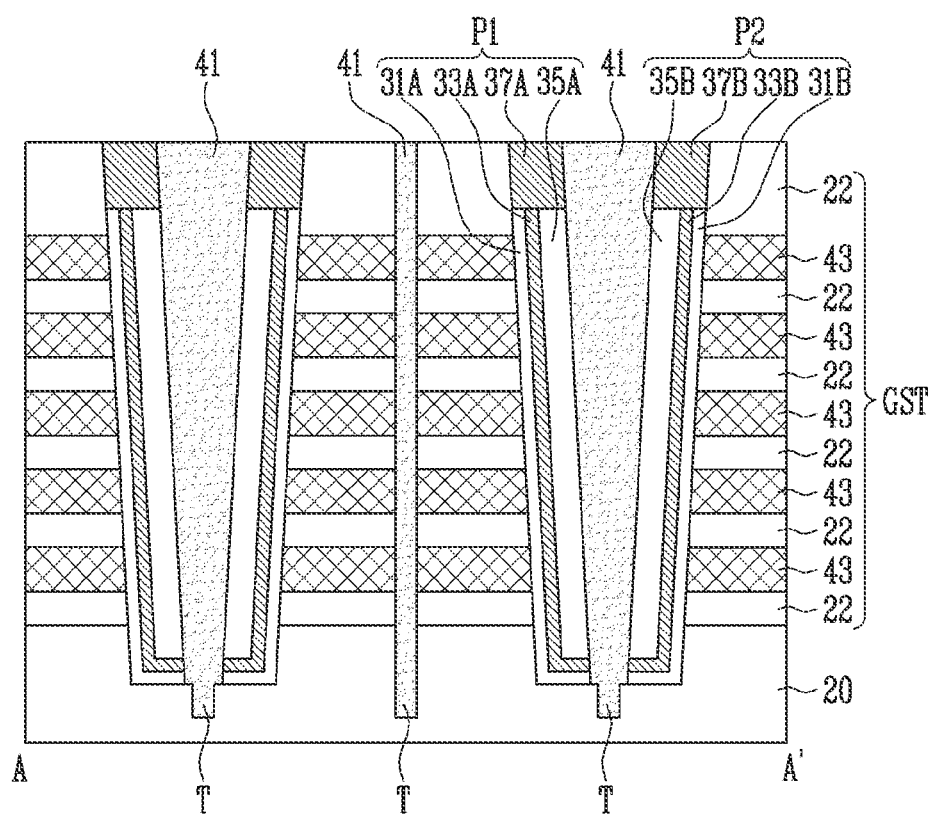

Referring to FIGS. 7A and 7B, cutting structures 41 are formed by filling the trenches with an insulating layer, A portion of each of the cutting structures 41, which penetrates the stack structure ST, has a line shape, and a portion of each of the cutting structures 41, which allows the first pillar structure P1 and the second pillar structure P2 to be spaced apart from each other, has a rhombus shape. For example, each of the cutting structures 41 may have a line shape, and have protrusion parts PT protruding toward the first pillar structure P1 and the second pillar structure P2 at the portion which avows the first pillar structure P1 and the second pillar structure P2 to be spaced apart from each other. The protrusion part PT may have a triangular shape.

Subsequently, a slit structure SLS is formed, which penetrates the stack structure ST. Thus, surfaces of the first material layers (21 shown in FIG. 6B) of the stack structure ST are exposed, and the first material layers (21 shown in FIG. 6B) are removed. Subsequently, spaces in which the first material layers are removed are filled with third material layers 43. Accordingly, a gate structure GST can be formed, in which the third material layers 43 and the second material layers 22 are alternately stacked.

In accordance with the above-described embodiment of the present disclosure, one pillar structure P can be isolated into a plurality of pillar structures P1 and P2 by the cutting structure 41. Thus, the number of memory cells implemented with one pillar structure P can be increased. Further, the angle formed by the section at the edge portion of the first channel layer 33A and the second channel layer 33B of each of the pillar structures P1 and P2 can become an acute angle smaller than 90 degrees due to the protrusion parts PT of the cutting structure 41. Accordingly, in an embodiment, an electric field of the first channel layer 33A and the second channel layer 33B is reinforced, so that the program efficiency of memory cells can be improved.

Figure 8A:
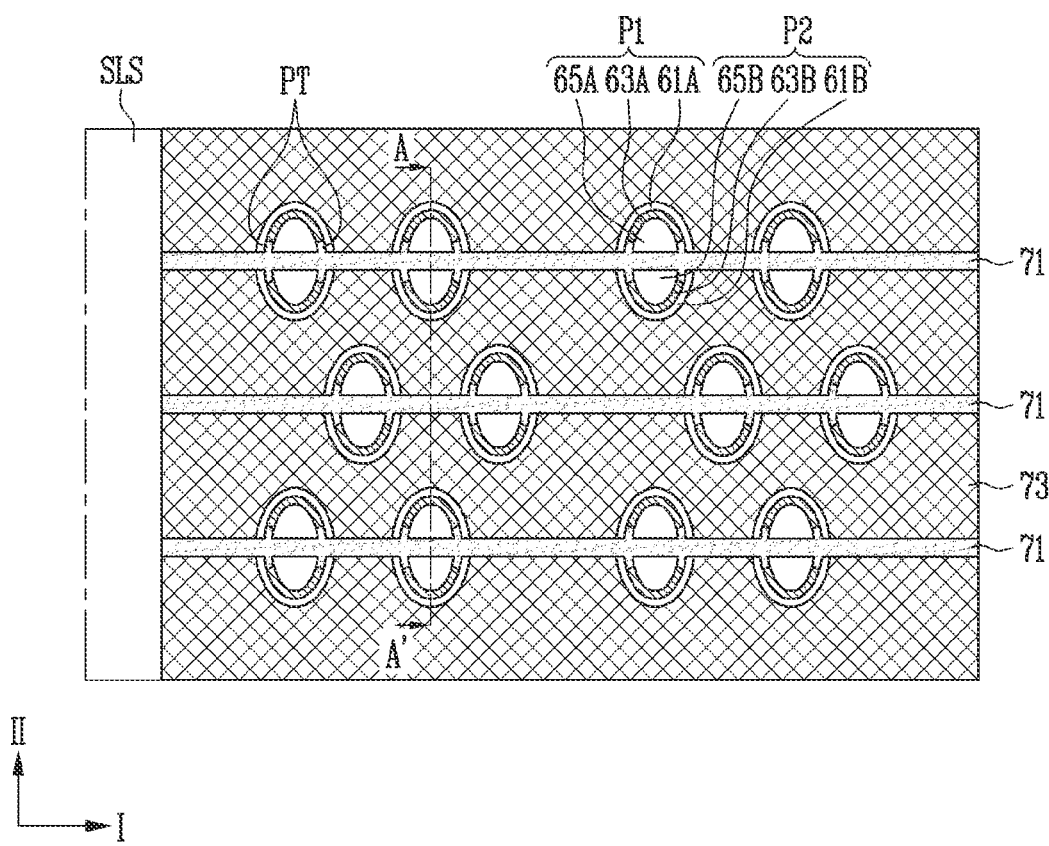
FIGS. 8A and 8B are views illustrating a structure of a semiconductor device in accordance with another embodiment of the present disclosure.
Figure 8B:
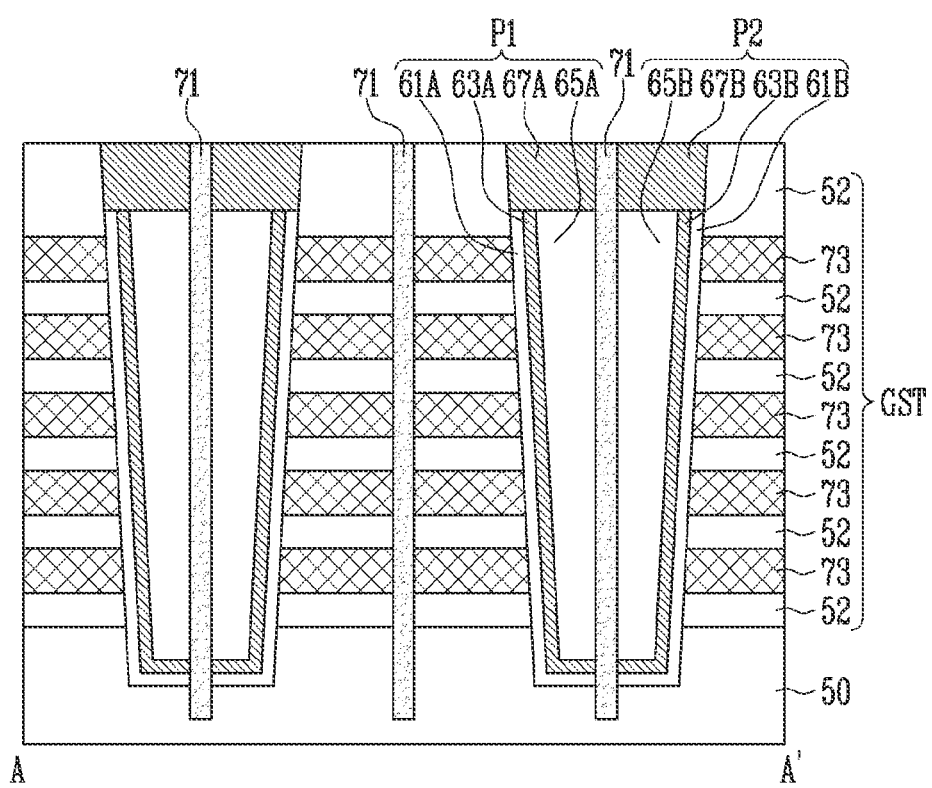

FIGS. 8A and 8B are views illustrating a structure of a semiconductor device in accordance with another embodiment of the present disclosure.

Referring to FIGS. 8A and 8B, the semiconductor device may include a gate structure GST, first and second pillar structures P1 and P2, a cutting structure 71, and a slit structure SLS. The semiconductor device may further include a base 50.

The gate structure GST may include conductive layers 73 and insulating layers 52, which are alternately stacked. The conductive layers 73 may be gate electrodes of a memory cell, a select transistor, and the like. The conductive layers 73 may include a conductive material such as poly-silicon, tungsten, molybdenum, or a metal. The insulating layers 52 may be used to insulate the stacked conductive layers 73 from each other. The insulating layers 52 may include an insulating material such as oxide, nitride, or an air gap.

The gate structure GST nay be located on the base 50. The in base 50 may be a semiconductor substrate, a source layer, or the like. The semiconductor substrate may include a source region doped with an impurity. The source layer may include a conductive material such as poly-silicon, tungsten, molybdenum, or a metal.

One first pillar structure P1 and one second pillar structure P2 may form one pillar structure pair, Each of a plurality of pillar structure pairs may penetrate gate structure GST. The plurality of pillar structure pairs may be arranged in a first direction I and a second direction II intersecting the first direction I.

A pair of first and second pillar structures P1 and P2 may be physical and electrically isolated from each other by the cutting structure 71. The pair of first and second pillar structures P1 and P2 may be adjacent to each other in the second direction II with the cutting structure 71 interposed therebetween, and have a symmetrical structure with respect to the cutting structure 71. The first pillar structure P1 and the second pillar structure P2 may have semicircular cylindrical shapes of which flat surfaces face each other.

In an embodiment, the first pillar structure P1 and the second pillar structure P2 may be channel structures including channel layers 63A and 63B, respectively. The first pillar structure P1 may be a first channel structure, and the second pillar structure P2 may be a second channel structure. First memory cells or select transistors may be located at positions at which the first pillar structure P1 and the conductive layers 73 intersect each other, and second memory cells or select transistors may be in located at positions at which the second pillar structure P2 and the conductive layers 73 intersect each other. A first memory cell and a second memory cell, which are adjacent to each other in the second direction II with the cutting structure 71 interposed therebetween may be individually driven.

The first pillar structure P1 may include a first memory layer 61A, a first channel layer 63A, and a first insulating core 65A. The first insulating core 65A may have a semicircular cylindrical shape, and the first channel layer 63A may be formed to surround a portion of a curved surface among sidewalls of the first insulating core 65A. In addition, the first memory layer 61A may be formed to surround a sidewall surface of the first channel layer 63A.

The first channel layer 63A may be a region in which a channel of a memory cell, a select transistor, or the like is formed. The first channel layer 63A may include a semiconductor material such as silicon or germanium. The first pillar structure P1 may further include a first conductive pad 67A. The first conductive pad 67A may be connected to the first channel layer 63A, and include a conductive material.

The second pillar structure P2 may have a structure similar to the structure of the first pillar structure P1.

The cutting structure 71 may extend down to the base 50 while penetrating between the first pillar structure P1 and the second pillar structure P2. The cutting structure 71 may be disposed between the flat surface of the first pillar structure P1 and the flat surface of the second pillar structure P2 to be in contact with the flat surfaces.

The cutting structure 71 may extend in the first direction while penetrating the gate structure GST. The cutting structure 71 may consecutively penetrate a plurality of pillar structure pairs. The cutting structure 71 may traverse at least two pillar structure pairs arranged in the first direction I.

The cutting structure 71 may have a line shape extending in the first direction I, and have protrusion parts PT protruding toward the first channel layer 63A and a second channel layer 63B at a portion at which the first channel layer 63A and the second channel layer 63B are in contact with each other. Accordingly, a length of a curved surface of each of the first channel layer 63A and the second channel layer 63B is shorter than a length of a curved surface of each of the first memory layer 61A and a second memory layer 61B. The cutting structure 71 may include an insulating material such as oxide, nitride, or an air gap.

According to the structure described above, one pillar structure pair can be isolated into a plurality of pillar structures P1 and P2 by using the cutting structure 71. Thus, the number of memory cells implemented with one pillar structure pair can be increased. Although the stacked number of the conductive layers 73 included in the gate structure GST is not increased, the number of memory cells included in the gate structure GST can be increased.

Further, an edge portion of the first channel layer 63A or the second channel layer 63B of each of the pillar structures P1 and P2 can be formed shorter than an edge portion of the first memory layer 61A or the second memory layer 61B of each of the pillar structures P1 and P2 by the protrusion parts PT of the cutting structure CS. Accordingly, in an embodiment, an electric field in edge regions of the first channel layer 63A and the second channel layer 63B is reinforced, so that the program efficiency of memory cells can be improved.

FIGS. 9A, 9B, 10A, 10B, 11A, 11B, 12A, 12B, 13A, and 13B are views illustrating a manufacturing method of a semiconductor device in accordance with another embodiment of the present disclosure.

Figure 9A:
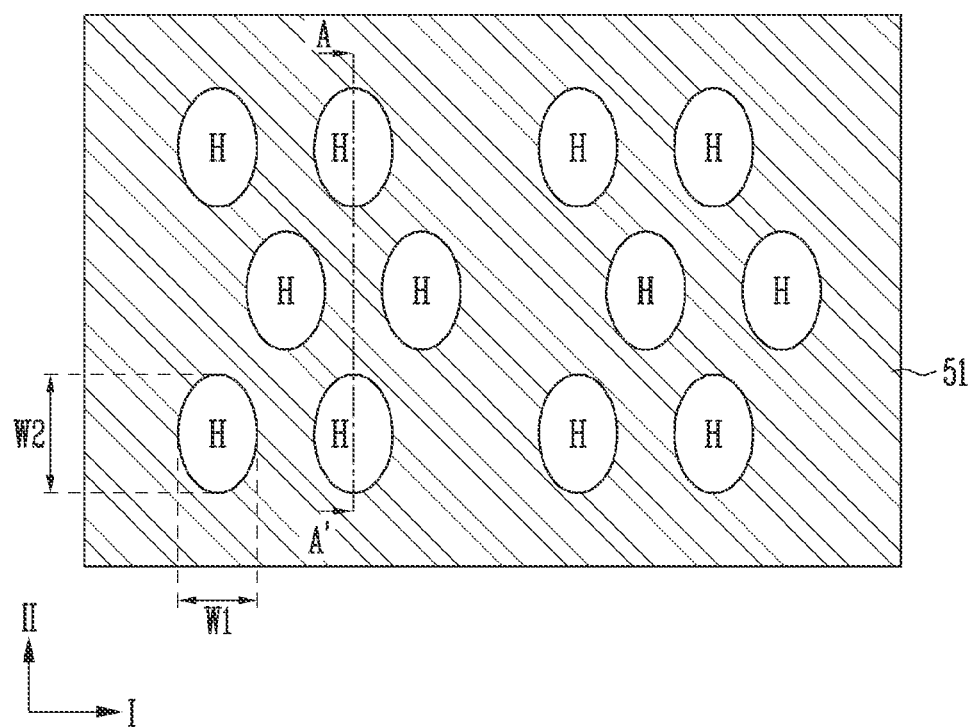
FIGS. 9A, 9B, 10A, 10B, 11A, 11B, 12A, 12B, 13A, and 13B are views illustrating a manufacturing method of a semiconductor device in accordance with another embodiment of the present disclosure.
Figure 9B:
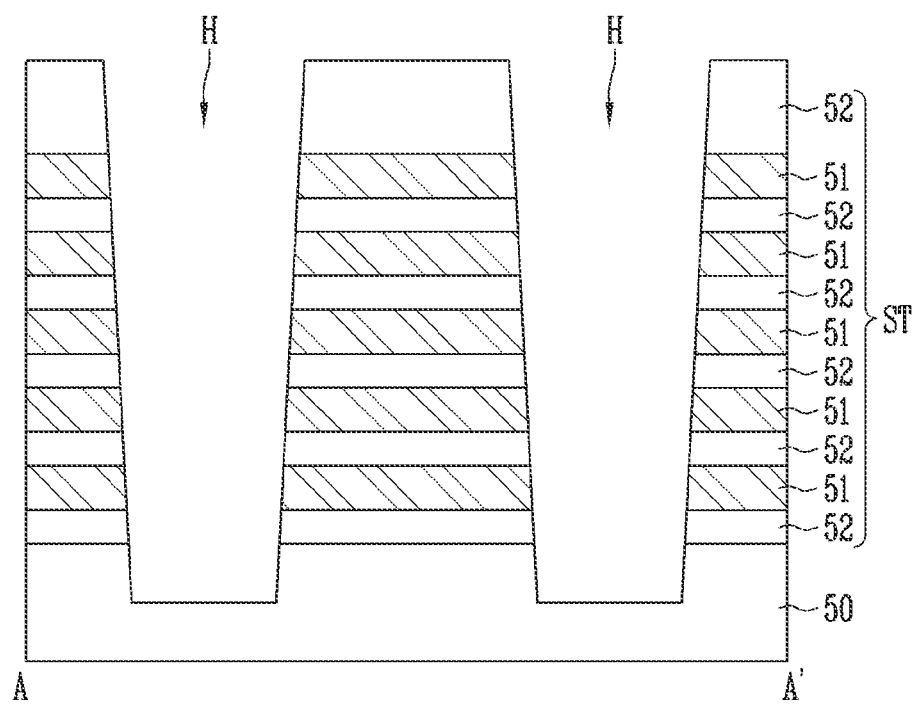

Referring to FIGS. 9A and 9B, a stack structure ST may be formed on a base 50. The base 50 may be a semiconductor substrate, a source structure, or the like. The semiconductor substrate may include a source region doped with an impurity. The source structure may include a source layer including a conductive material such as poly-silicon, tungsten, molybdenum, or a metal. Alternatively, the source structure may include a sacrificial layer to be replaced with the source layer in a subsequent process.

First material layers 51 and second material layers 52 may be alternately formed, thereby forming the stack structure ST. The first material layers 51 may include a material having a high etch selectivity with respect to the second material layers 52, In an example, the first material layer 51 may include a sacrificial material such as nitride, and the second material layers 52 may include an insulating material such as oxide. In another example, the first material layers 51 may include a conductive in material such as poly-silicon, tungsten or molybdenum, and the second material layers 52 may include an insulating material such as oxide.

Subsequently, holes H may be formed, which penetrate the stack structure ST. The holes H may be arranged in a first direction I and a second direction II intersecting the first direction I. Holes H adjacent to each other in the first direction I may be arranged such that the centers of the holes H accord with each other. Holes H arranged in the second direction II may be arranged such that the centers of the holes H are dislocated. The holes H may have a shape such as a circular shape, an elliptical shape, or a polygonal shape.

A plane of each of the holes H may have a first width W1 in the first direction I, and have a second width W2 in the second direction II. The first width W1 and the second width W2 may be the same or be different from each other. For example, the second width W2 may be wider than the first width W1.

Figure 10A:
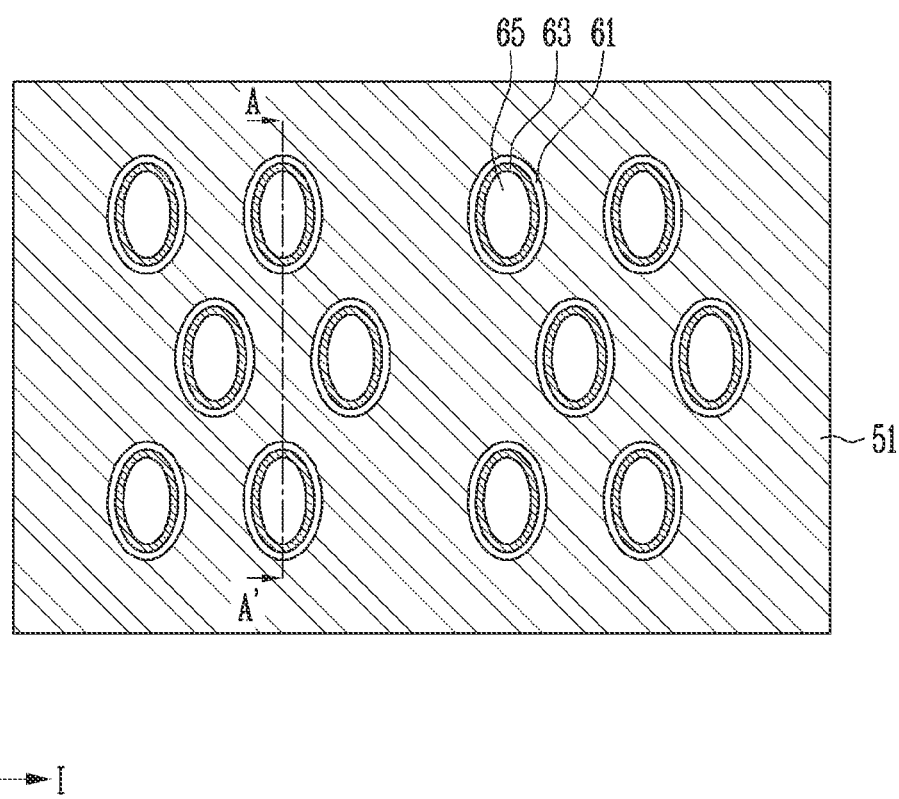
Figure 10B:
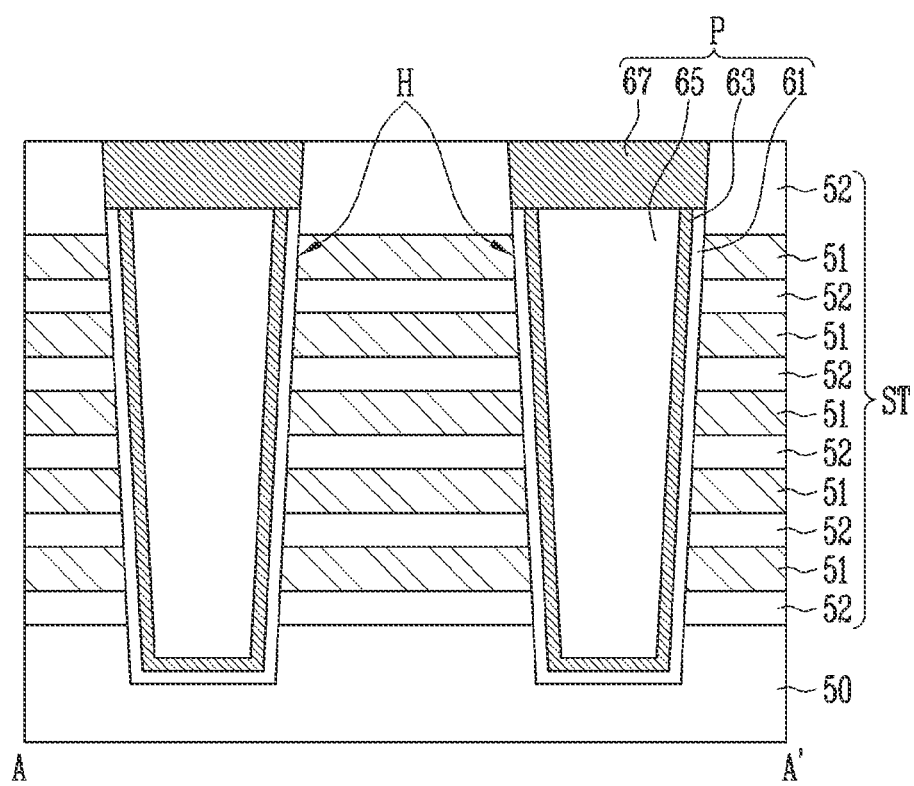

Referring to FIGS. 10A and 10B, pillar structures P may be formed in the holes H. Each of the pillar structures P may include a memory layer 61, a channel layer 63, and an insulating core 65. In an embodiment, after the memory layer 61 is formed along a sideman and a bottom surface of the hole H penetrating the stack structure ST, the channel layer 63 may be formed along a surface of the memory layer 61. Subsequently, after the insulating core 65 is formed such that a central region of the hole H is buried, a conductive pad 67 may be formed. For example, the memory layer 61, the channel layer 63, and the insulating core 65 may be etched such that a height of an uppermost surface of the memory layer 61, the channel layer 63, and the insulating core 65 is equal to or lower than a height of an uppermost second material layers 52, and the conductive pad 67 may be formed to fill the etched region.

Figure 11A:
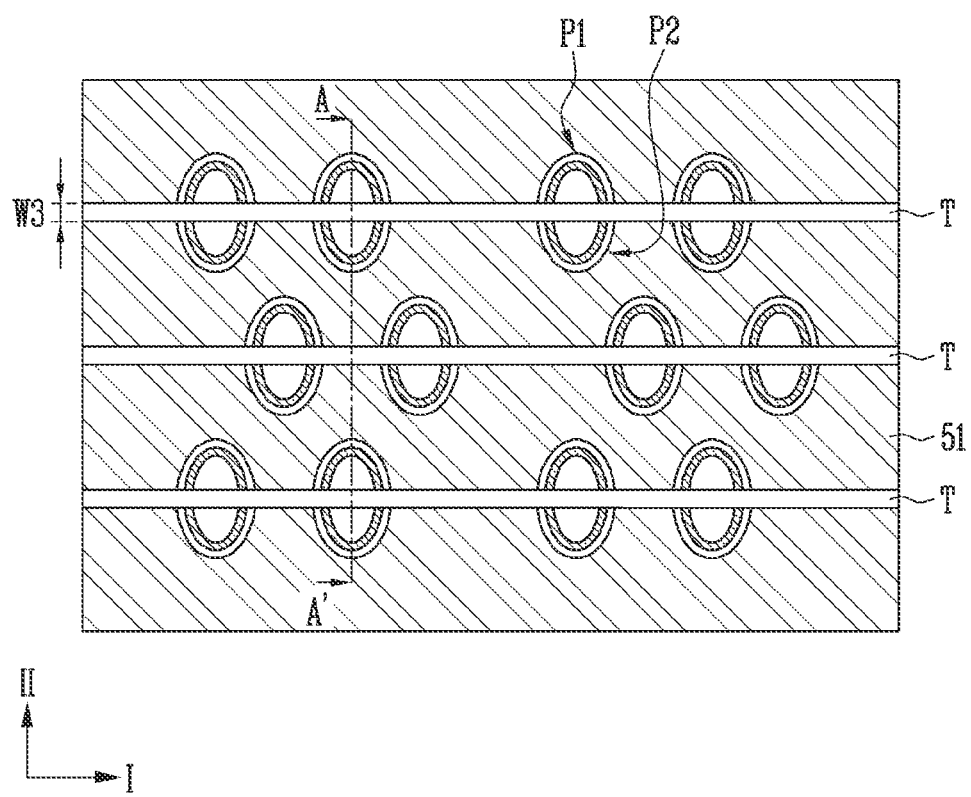
Figure 11B:
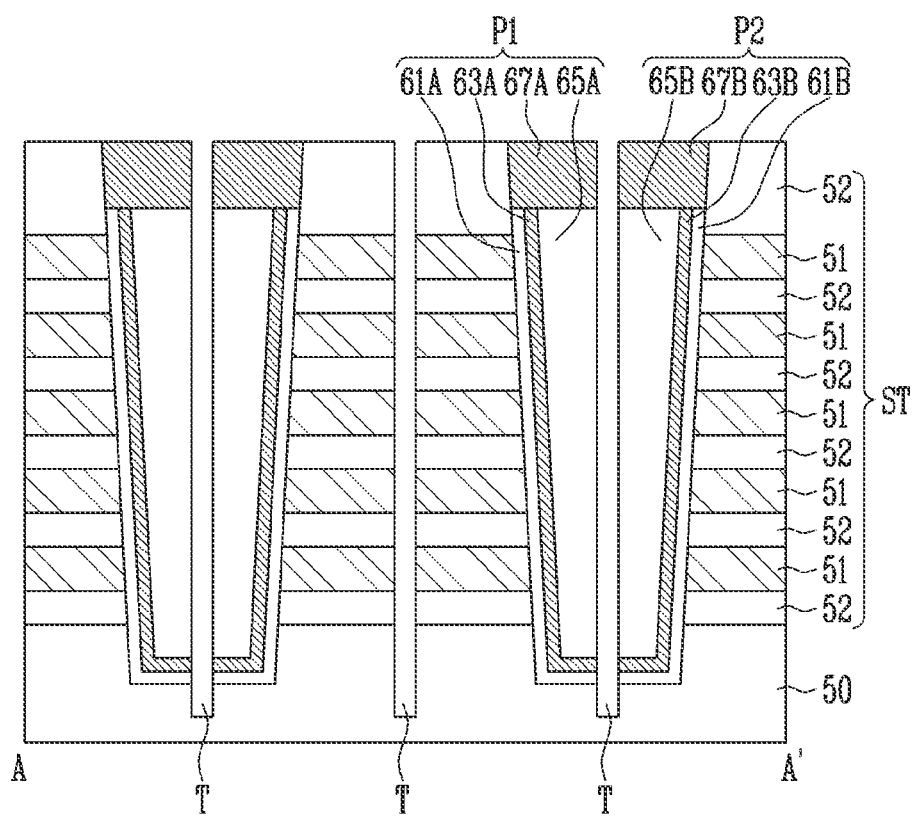

Referring to FIGS. 11A and 11B, a plurality of trenches T extending in the first direction I may be formed by performing an etching process. The plurality of trenches T may have a line shape penetrating the stack structure ST and the pillar structures. Accordingly, each of the pillar structures P shown in FIGS. 10A and 10B may be isolated into a first pillar structure P1 and a second pillar structure P2, Widths W3 of the plurality of trenches T may be equal to each other. In addition, sidewalls of the first pillar structure P1 and the second pillar structure P2 may be exposed by the plurality of line-shaped trenches T. That is, sidewalls of a first conductive pad 67A, a first insulating core 65A, a first channel layer 63A, and a first memory layer 61A of the first pillar structure P1, which are in contact with the trench T, may be exposed, and sidewalls of a second conductive pad 67B, a second insulating core 65B, a second channel layer 63B, and a second memory layer 61B of the second pillar structure P2, which are in contact with the trench T, may be exposed.

Figure 12A:
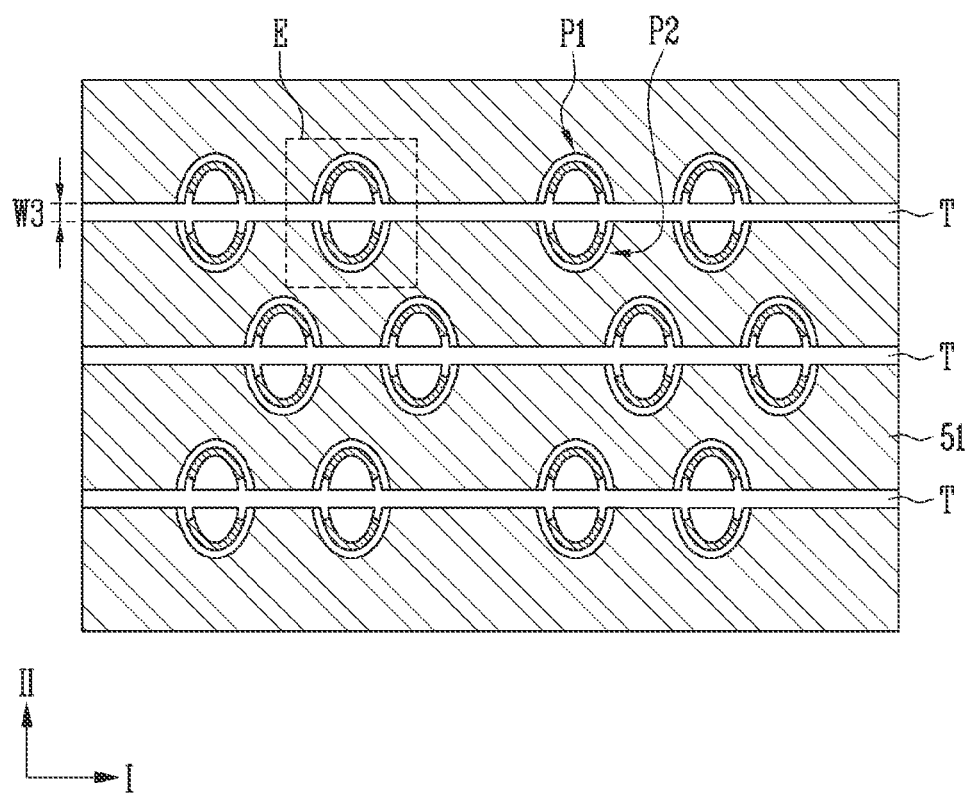
Figure 12B:
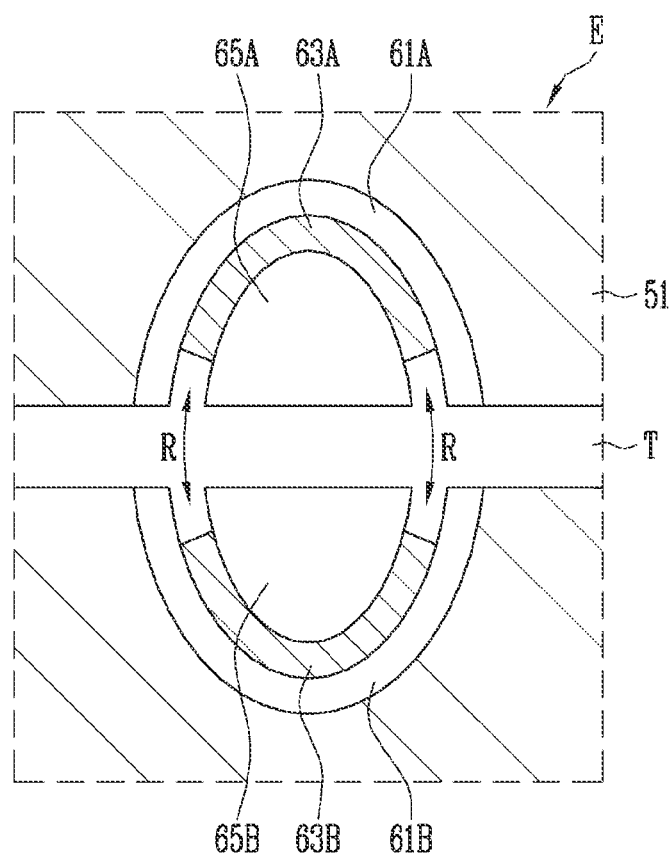

Referring to FIGS. 12A and 12B, a recess region R is formed by etching, to a certain depth, both edge portions of the first channel layer 63A of the first pillar structure P1 and the second channel layer 63B of the second pillar structure P2, which are in contact with the trench T, through an additional etching process. Accordingly, the first channel layer 63A is in contact with a curved surface of the semicircular cylindrical first insulating core 65A, but is formed to surround only a portion of the curved surface of the first insulating core 65A. The second channel layer 63B is in contact with a curved surface of the semicircular cylindrical second insulating core 65B, but is formed to surround only a portion of the curved surface of the second insulating core 65B. Also, the first channel layer 63A has a curve length formed shorter than a curve length of the first memory layer 61A, and the second channel layer 63B has a curve length formed shorter than a curve length of the second memory layer 61B. That is, the first memory layer 61A surrounds a curved surface of the first channel layer 63A, but both edge portions of the first memory layer 61A further protrude than the edge portions of the first channel layer 63A. In addition, the second memory layer 61B surrounds a curved surface of the second channel layer 63B, but both edge portions of the second memory layer 61B further protrude than the edge portions of the second channel layer 63B.

Figure 13A:
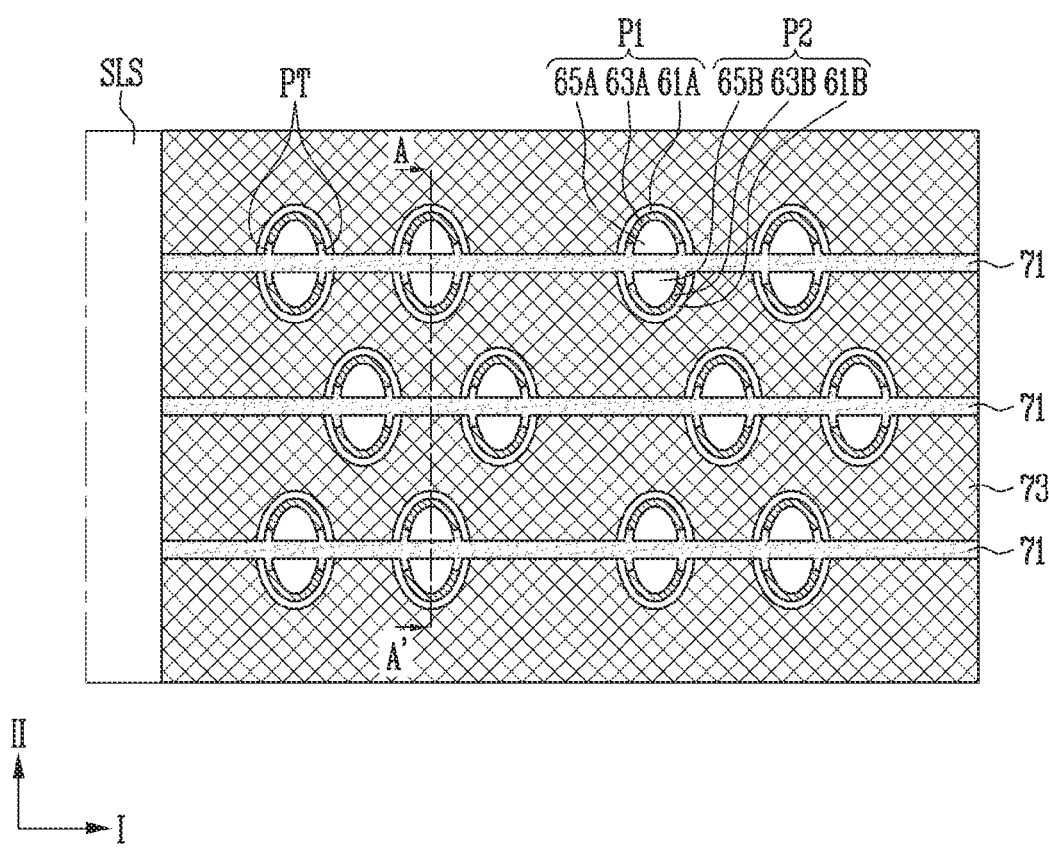
Figure 13B:
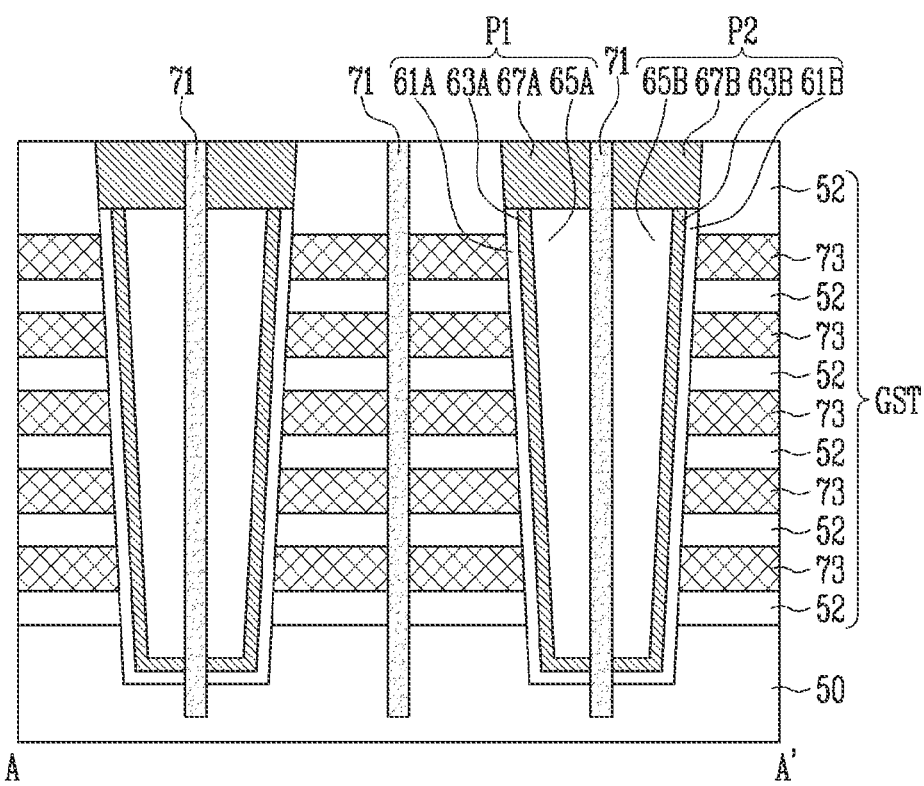

Referring to FIGS. 13A and 13B, cutting structures 71 are formed by filling the trenches. A portion of each of the cutting structures 71, which allows the stack structure ST or the first pillar structure P1 and the second pillar structure P2 to be spaced apart from each other, has a line shape, and the cutting structure 71 is formed to have protrusion parts PT at portions of the cutting structure 71, which are in contact with both edge portions of the first channel layer 63A of the first pillar structure P1 and portions of the cutting structure 71, which are in contact with both edge portions of the second channel layer 63B of the second pillar structure P2.

Subsequently, a slit structure SLS is formed, which penetrates the stack structure ST. Thus, surfaces of the first material layers (51 shown in FIG. 11B) of the stack structure ST are exposed, and the first material layers (51 shown in FIG. 11B) are removed. Subsequently, spaces in which the first material layers are removed are filled with third material layers 73. Accordingly, a gate structure GST can be formed, in which the third material layers 73 and the second material layers 52 are alternately stacked, FIG. 14 is a diagram illustrating a memory system in accordance with an embodiment of the present disclosure.

Figure 14:
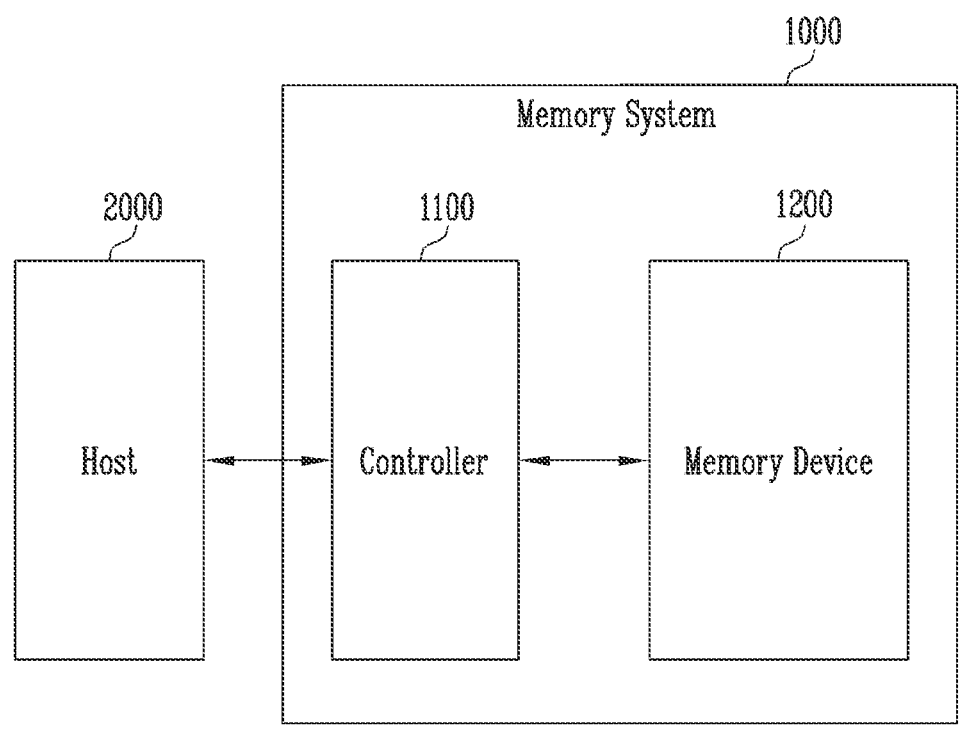
FIG. 14 is a diagram illustrating a memory system in accordance with an embodiment of the present disclosure.

Referring to FIG. 14, the memory system 1000 may include a memory device 1200 configured to store data and a controller 1100 configured to communicate between the memory device 1200 and a host 2000.

The host 2000 may be a device or system which stores data in the memory system 1000 or retrieves data from the memory system 1000. The host 2000 may generate requests for various operations, and output the generated requests to the memory system 1000. The requests may include a program request for a program operation, a read request for a read operation, an erase request for an erase operation, and the like. The host 2000 may communicate with the memory system 1000 through various interfaces such as Peripheral Component Interconnect-Express (PCI-E), Advanced Technology Attachment (ATA), Serial ATA (SATA), Parallel ATA (DATA), Serial Attached SCSI (SAS), Non-Volatile Memory in Express (NVMe), a Universal Serial Bus (USB), a Multi-Media Card (MMC), an Enhanced Small Disk Interface (ESDI), and Integrated Drive Electronics (IDE).

The host 2000 may include at least one of a computer, a portable digital device, a tablet, a digital camera, a digital audio player, a television, a wireless communication device, and a cellular phone, but embodiments of the present disclosure are not limited thereto.

The controller 1100 may control overall operations of the memory system 1000. The controller 1100 may control the memory device 1200 according to a request of the host 2000. The controller 1100 may control the memory device 1200 to perform a program operation, a read operation, an erase operation, and the like according to a request of the host 2000. Alternatively, the controller 1100 may perform a background operation, etc. for improving the performance of the memory system 1000 without any request of the host 2000.

The controller 1100 may transmit a control signal and a data signal to the memory device 1200 to control an operation of the memory device 1200. The control signal and the data signal may be transmitted to the memory device 1200 through different input/output lines. The data signal may include a command, an address or data. The control signal may be used to distinguish a period in which the data signal is input.

The memory device 1200 may perform a program operation, a read operation, an erase operation, and the like under the control of the controller 1100. The memory device 1200 may be implemented with a volatile memory device in which stored data disappears when the supply of power is interrupted or a nonvolatile memory device in which stored data is retained even when the supply of power is interrupted. The memory device 1200 may be a semiconductor device having the structure described above with reference to FIGS. 2A and 2B or 8. The memory device 1200 may be a semiconductor device manufactured by the manufacturing method described above with reference to FIGS. 3A, 3B, 4A, 4B, 5A, 5B, 6A to 6C, 7A, and 7B or FIGS. 9A, 9B, 10A, 10B, 11A, 11B, 12A, 12B, 13A, and 13B.

Figure 15:
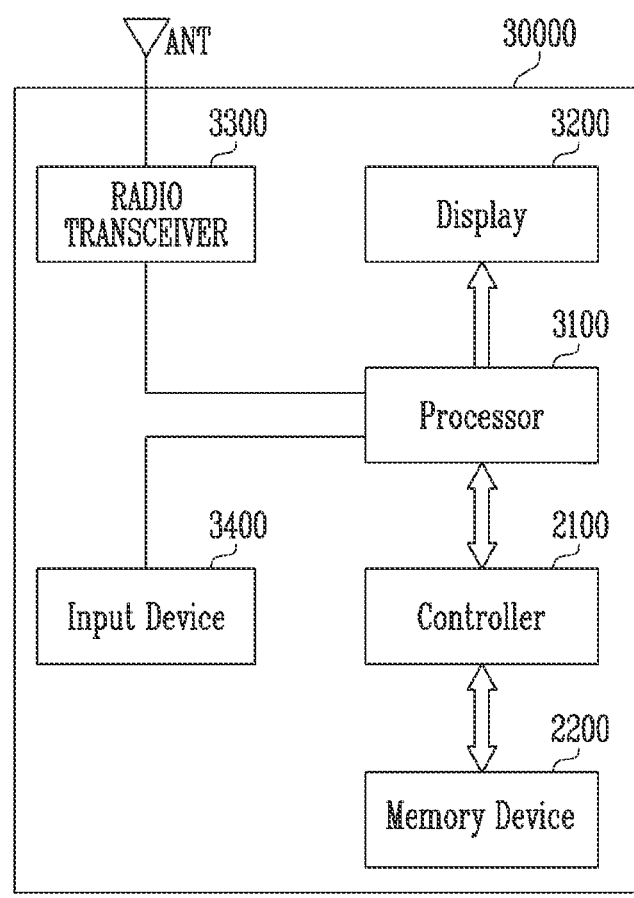
FIG. 15 is a diagram illustrating a memory system in accordance with an embodiment of the present disclosure.

FIG. 15 is a diagram illustrating a memory system in accordance with an embodiment of the present disclosure.

Referring to FIG. 15, the memory system 30000 may be implemented as a cellular phone, a smart phone, a tablet PC, a personal digital assistant (PDA), or a wireless communication device. The memory system 30000 may include a memory device 2200 and a controller 2100 capable of controlling an operation of the memory device 2200.

The controller 2100 may control a data access operation of the memory device 2200, e.g., a program operation, an erase operation, a read operation, or the like under the control of a processor 3100.

Data programmed in the memory device 2200 may be output through a display 3200 under the control of the controller 2100.

A radio transceiver 3300 may transmit/receive radio signals through an antenna ANT. For example, the radio transceiver 3300 may change a radio signal received through the antenna ANT into a signal that can be processed by the processor 3100. Therefore, the processor 3100 may process a signal output from the radio transceiver 3300 and transmit the processed signal to the controller 2100 or the display 3200. The controller 2100 may transmit the signal processed by the processor 3100 to the memory device 2200. Also, the radio transceiver 3300 may change a signal output from the processor 3100 into a radio signal, and output the changed radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mouse, a keypad, or a keyboard. The processor 3100 may control an operation of the display 3200 such that data output from the controller 2100, data output from the radio transceiver 3300, or data output from the input device 3400 can be output through the display 3200.

In some embodiments, the controller 2100 capable of controlling an operation of the memory device 2200 may be implemented as a part of the processor 3100, or be implemented as a chip separate from the processor 3100.

Figure 16:
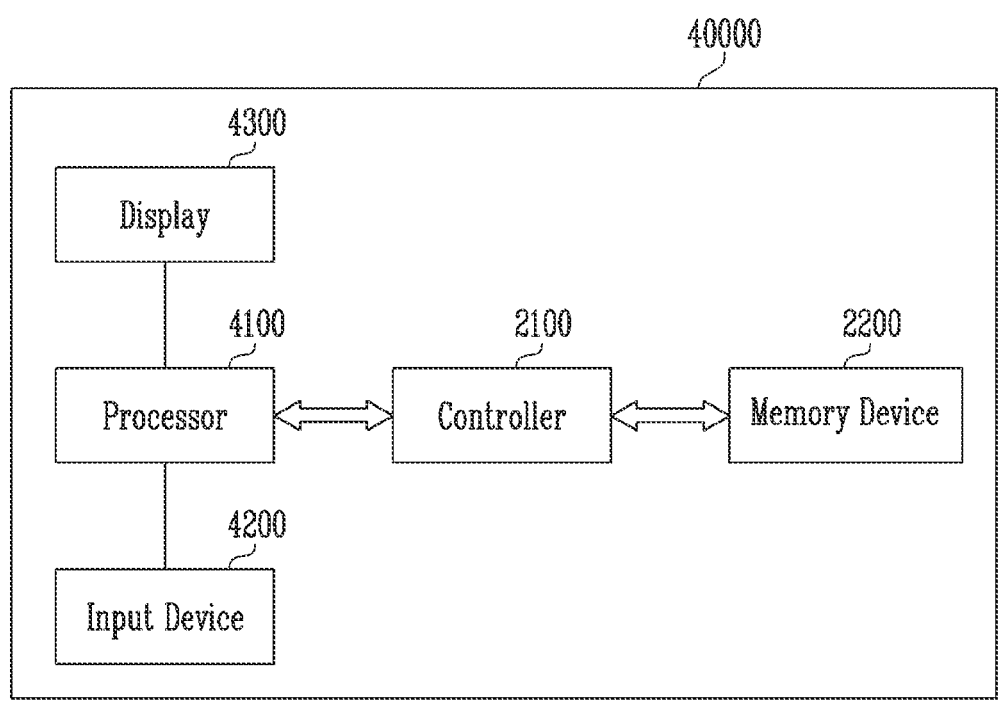
FIG. 16 is a diagram illustrating a memory system in accordance with an embodiment of the present disclosure.

FIG. 16 is a diagram illustrating a memory system in accordance with an embodiment of the present disclosure.

Referring to FIG. 16, the memory system 40000 may be implemented as a personal computer (PC), a tablet PC, a net-book, an e-reader, a personal digital assistant (PDA), a portable multi-media player (PMP), an MP3 player, or an MP4 player.

The memory system 40000 may include a memory device 2200 and a controller 2100 capable of controlling a data processing operation of the memory device 2200.

A processor 4100 may output data stored in the memory device 2200 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the controller 2100.

Figure 17:
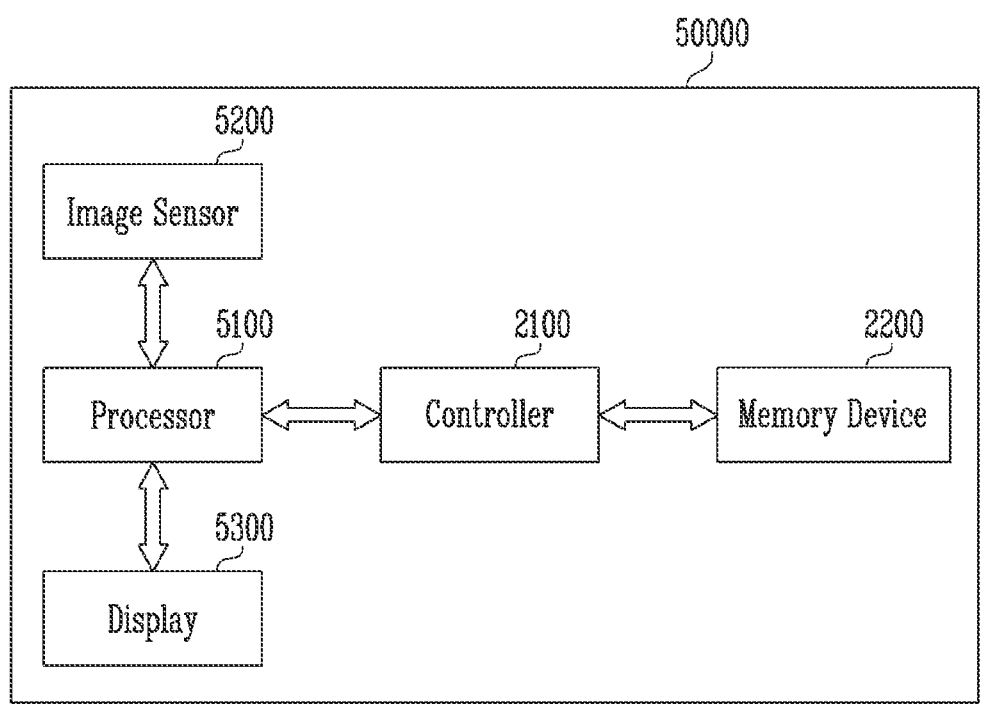
FIG. 17 is a diagram illustrating a memory system in accordance with an embodiment of the present disclosure.

In some embodiments, the controller 2100 capable of controlling an operation of the memory device 2200 may be implemented as a part of the processor 4100, or be implemented as a chip separate from the processor FIG. 17 is a diagram illustrating a memory system in accordance with an embodiment of the present disclosure.

Referring to FIG. 17, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a memory device 2200 and a controller 2100 capable of controlling a data processing operation of the memory device 2200, e.g., a program operation, an erase operation, or a read operation.

An image sensor 5200 of the memory system 50000 may convert an optical image into digital signals, and the converted digital signals may be transmitted to a processor 5100 or the controller 2100. Under the control of the processor 5100, the converted digital signals may be output through a display 5300, or be stored in the memory device 2200 through the controller 2100. In addition, data stored in the memory device 2200 may be output through the display 5300 under the control of the processor 5100 or the controller 2100.

In some embodiments, the controller 2100 capable of controlling an operation of the memory device 2200 may be implemented as a part of the processor 5100, or be implemented as a chip separate from the processor 5100.

Figure 18:
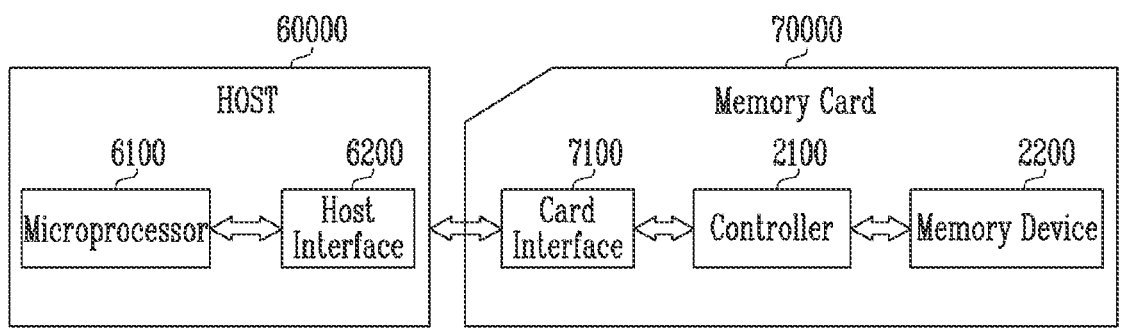
FIG. 18 is a diagram illustrating a memory system in accordance with an embodiment of the present disclosure.

FIG. 18 is a diagram illustrating a memory system in accordance with an embodiment of the present disclosure.

Referring to FIG. 18, the memory system 70000 may be implemented as a memory card or a smart card. The memory system 70000 may include a memory device 2200, a controller 2100, and a card interface 7100.

The controller 2100 may control data exchange between the memory device 2200 and the card interface 7100. In some embodiments, the card interface 7100 may be a secure digital (SD) card interface or a mufti-media card (MMC) interface, but the present disclosure is not limited in thereto.

The card interface 7100 may interface data exchange between a host 60000 and the controller 2100 according to a protocol of the host 60000. In some embodiments, the card interface 7100 may support a universal serial bus (USB) protocol and an inter-chip (IC)—USB protocol. The card interface 7100 may mean hardware capable of supporting a protocol used by the host 60000, software embedded in the hardware, or a signal transmission scheme.

When the memory system 70000 is connected to a host interface 6200 of the host 60000 such as a PC, a tablet PC, a digital camera, a digital audio player, a cellular phone, console video game hardware, or a digital set-top box, the host interface 6200 may perform data communication with the memory device 2200 through the card interface 7100 and the controller 2100 under the control of a microprocessor 6100.

In accordance with the present disclosure, in an embodiment, a first channel pattern and a second channel pattern, which are shared by a conductive pattern, are isolated from each other, so that the degree of integration of memory cells can be improved.

While the present disclosure has been shown and described with reference to certain examples of embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described examples of embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the examples of embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A semiconductor device comprising:
a gate structure including conductive layers and insulating layers, which are alternately stacked;
channel structures penetrating the gate structure, the channel structures being arranged in a first direction; and
a cutting structure extending in the first direction, the cutting structure consecutively penetrating the channel structures,
wherein each of the channel structures includes a first channel in structure and a second channel structure, which are isolated from each other by the cutting structure, and wherein portions of the first channel structure and the second channel structure, which are in contact with the cutting structure, are concave.

2. The semiconductor device of claim 1, wherein the cutting structure includes protrusion parts protruding toward the first channel structure and the second channel structure at portions of the cutting structure, which are in contact with the first channel structure and the second channel structure.

3. The semiconductor device of claim 2, wherein the protrusion part has substantially a triangular pattern.

4. The semiconductor device of claim 1, wherein each of the first channel structure and the second channel structure includes:
   an insulating core extending in a vertical direction, the insulating core having a curved surface;
   a channel layer surrounding the curved surface of the insulating core; and
   a memory layer surrounding a surface of the channel layer,
   wherein sections of both edge portions of the channel layer and the memory layer form an acute angle.

5. The semiconductor device of claim 1, wherein a portion of the cutting structure, which penetrates the gate structure, has substantially a line shape.

6. The semiconductor device of claim 1, wherein a portion of the cutting structure, which penetrates between the first channel structure and the second channel structure, has substantially a rhombus shape.

7. The semiconductor device of claim 1, therein the cutting structure includes an insulating material.

8. A method of manufacturing a semiconductor device, the method comprising:
   forming a stack structure;
   forming channel structures penetrating the stack structure, the channel structures being arranged in a first direction;
   isolating each of the channel structures into a first channel structure and a second channel structure, wherein an isolation space is formed by performing an etching process of etching sidewalls of the first channel structure and the second channel structure to form portions of the first channel structure and the second channel structure that are concave; and
   forming a cutting structure by filling the isolation space with a first insulating material.

9. The method of claim 8, wherein the forming of the isolation space includes:
   forming a trench isolating each of the channel structures into the first channel structure and the second channel structure while consecutively penetrating the channel structures, the trench extending in the first direction; and
   etching, to a certain thickness, sidewall surfaces of the first channel structure and the second channel structure, which are exposed by the trench, by performing an additional etching process.

10. The method of claim 8, wherein the forming of the channel structures includes:
    forming holes penetrating the stack structure;
    forming a memory layer on sidewalls of the holes;
    forming a channel layer on a sidewall of the memory layer; and
    forming an insulating core by filling central regions of the holes with a second insulating material.

11. The method of claim 10, wherein, in the etching process, the first channel structure and the second channel structure are isolated from each other, wherein the etching process is performed such that both edge portions of the channel layer and the memory layer of each of the first channel structure and the second channel structure form an acute angle.

12. The method of claim 9, wherein portions of the isolation space, which are in contact with the first channel structure and the second channel structure, extend in substantially a triangular shape through the etching process.

13. A semiconductor device comprising:
    a gate structure including conductive layers and insulating layers, which are alternately stacked;
    channel structures penetrating the gate structure, the channel structures being arranged in a first direction; and
    a cutting structure extending in the first direction, the cutting structure consecutively penetrating the channel structures,
    wherein each of the channel structures includes a first channel structure and a second channel structure, which are isolated from each other by the cutting structure, and
    wherein the cutting structure includes protrusion parts protruding to the inside of the first channel structure and the second channel structure.

14. The semiconductor device of claim 13, wherein each of the first channel structure and the second channel structure includes:
    an insulating core extending in a vertical direction, the insulating core having substantially a semicircular cylindrical structure;
    a channel layer surrounding a portion of a curved sidewall of the insulating core; and
    a memory layer surrounding a surface of the channel layer.

15. The semiconductor device of claim 14, wherein the cutting structure is in contact with a planar sidewall of the insulating core, both edge portions of the channel layer, and both edge portions of the memory layer.

16. The semiconductor device of claim 15, wherein the cutting structure has the protrusion part at portions of the cutting structure, which are in contact with both the edge portions of the channel layer.

17. The semiconductor device of claim 13, wherein the cutting structure includes an insulating material.

18. A method of manufacturing a semiconductor device, the method comprising:
    forming a stack structure;
    forming channel structures penetrating the stack structure, the channel structures being arranged in a first direction;
    forming a trench isolating each of the channel structures into a first channel structure and a second channel structure while consecutively penetrating the channel structures, the trench extending in the first direction;
    etching, to a certain thickness, a channel layer of the first channel structure and the second channel structure, which is exposed by the trench, by performing an etching process; and
    forming a cutting structure by filling the trench with an insulating material.

19. The method of claim 18, wherein the forming of the channel structures includes:
    forming holes penetrating the stack structure;
    forming a memory layer on sidewalls of the holes;
    forming a channel layer on a sidewall of the memory layer; and
    forming an insulating core by filling central regions of the holes with the insulating material.

20. The method of claim 19, wherein, in the etching process, both edge portions of the memory layer are formed to further protrude than both edge portions of the channel layer, which are exposed by the trench, by etching the both edge portions of the channel layer to a certain thickness.

* * * * *